United States Patent
Nakamura et al.

(10) Patent No.: US 7,864,271 B2
(45) Date of Patent: Jan. 4, 2011

(54) DISPLAY DEVICE

(75) Inventors: Kozo Nakamura, Kashiba (JP); Shun Ueki, Nara (JP); Tokio Taguchi, Tenri (JP); Akiko Itou, Uji (JP)

(73) Assignee: Sharp Kabushiki Kaisha, Osaka (JP)

( * ) Notice: Subject to any disclaimer, the term of this patent is extended or adjusted under 35 U.S.C. 154(b) by 162 days.

(21) Appl. No.: 12/303,383

(22) PCT Filed: May 31, 2007

(86) PCT No.: PCT/JP2007/061119

§ 371 (c)(1),
(2), (4) Date: Dec. 4, 2008

(87) PCT Pub. No.: WO2007/148519

PCT Pub. Date: Dec. 27, 2007

(65) Prior Publication Data

US 2009/0115952 A1    May 7, 2009

(30) Foreign Application Priority Data

Jun. 19, 2006    (JP) .............................. 2006-169206

(51) Int. Cl.
*G02F 1/1335* (2006.01)
(52) U.S. Cl. .................. 349/109; 349/106; 349/108
(58) Field of Classification Search .............. 349/108, 349/109
See application file for complete search history.

(56) References Cited

U.S. PATENT DOCUMENTS

| | | | |
|---|---|---|---|
| 4,800,375 A | 1/1989 | Silverstein et al. |
| 7,187,425 B2 | 3/2007 | Yamazaki |
| 2004/0174389 A1 | 9/2004 | Ben-David et al. |
| 2005/0041188 A1 | 2/2005 | Yamazaki |
| 2005/0122294 A1 | 6/2005 | Ben-David et al. |
| 2005/0134785 A1 | 6/2005 | Roth et al. |
| 2006/0038953 A1 | 2/2006 | Moriya |
| 2006/0072058 A1 | 4/2006 | Rho |
| 2007/0195232 A1 | 8/2007 | Kuribayashi et al. |
| 2008/0024410 A1 | 1/2008 | Ben-David et al. |
| 2008/0030447 A1 | 2/2008 | Ben-David et al. |
| 2008/0192178 A1 | 8/2008 | Ben-David et al. |
| 2008/0316235 A1 | 12/2008 | Okazaki et al. |

(Continued)

FOREIGN PATENT DOCUMENTS

CN    1319260 A    10/2001

(Continued)

OTHER PUBLICATIONS

Official Communication issued in International Patent No. PCT/JP2007/061119, mailed on Jul. 3, 2007.

*Primary Examiner*—Richard H Kim
(74) *Attorney, Agent, or Firm*—Keating & Bennett, LLP

(57) ABSTRACT

A display device in which an image with a wide color reproduction range and bright red can be displayed is provided. The display device is a display device such as, for example, a liquid crystal display device, a cathode ray tube, an organic electroluminescent display device, a plasma display panel, and a field emission display. The display device includes a display surface including a pixel having red, green, blue, and yellow sub-pixels, wherein the red sub-pixel preferably has the largest aperture area.

36 Claims, 19 Drawing Sheets

U.S. PATENT DOCUMENTS

2009/0135129 A1    5/2009    Roth et al.

FOREIGN PATENT DOCUMENTS

| | | |
|---|---|---|
| JP | 2001-209047 A | 8/2001 |
| JP | 2002-523807 A | 7/2002 |
| JP | 2005-062416 A | 3/2005 |
| JP | 2005-091875 A | 4/2005 |
| JP | 2005-156925 A | 6/2005 |
| JP | 2005-523465 A | 8/2005 |
| JP | 2005-331841 A | 12/2005 |
| JP | 2005-352140 A | 12/2005 |
| JP | 2006-058604 A | 3/2006 |
| JP | 2006-106659 A | 4/2006 |
| JP | 2006-139058 A | 6/2006 |
| JP | 2007-219345 A | 8/2007 |
| WO | 00/11728 A1 | 3/2000 |
| WO | 03/088203 A1 | 10/2003 |
| WO | 2006/019025 A1 | 2/2006 |

DISPLAY DEVICE

BACKGROUND OF THE INVENTION

1. Field of the Invention

The present invention relates to a display device. More specifically, the present invention relates to a display device preferably used in a liquid crystal display device, and the like.

2. Description of the Related Art

Currently, various display devices have been used in various applications. A common display device provides color display using a pixel including sub-pixels of three primary colors: red, green, and blue. In such a liquid crystal display device, chromaticity of color displayed in each sub-pixel is adjusted so that the color has a high chroma. As a result, a range of colors which can be displayed (color reproduction range) can be extended. In this case, a transmittance of light which passes through a color filter arranged in each sub-pixel is reduced. Accordingly, use efficiency of light is reduced, and thereby white having an insufficient lightness is displayed.

For this problem, a multi-primary color display device which includes a yellow sub-pixel having a color filter with a high transmittance, in addition to red, green, and blue sub-pixels, is proposed (for example, refer to Japanese Kokai Publication No. 2001-209047). Such a liquid crystal display has a configuration shown in FIG. 36, in which pixels 11w each composed of four sub-pixels 5Rw, 5Gw, 5Bw, and 5Yw which display red, green, blue, and yellow, respectively, and the pixels 11w constitute a display surface 500w. In addition, the following color display device is disclosed. A pixel includes sub-pixels of five colors of red, green, blue, cyan, and yellow, and the sub-pixels are arrayed in the first repeating pattern of red, green, blue, and yellow or in the second repeating pattern of red, green, cyan, and yellow. These liquid crystal devices include a yellow sub-pixel having a color filter with a high transmittance, which suppresses a lightness of white from being reduced. Further, the number of primary colors is increased. As a result, the color reproduction range can be extended.

In a conventional four-primary-color display device, the number of the primary colors used for display is just increased and sufficient display qualities are not obtained. In a display device shown in Japanese Kokai Publication No. 2001-209047, according to a display device having a display surface constituted by pixels each including red, green, blue, and yellow sub-pixels that are the same in aperture area (an area of a region used for display (active region or effective region)), an image with a wide color reproduction range can be displayed, but displayed red is dark. As a result, visibility is deteriorated.

U.S. Patent Application Publication No. 2005/0134785 also disclosed a conventional display device.

SUMMARY OF THE INVENTION

Preferred embodiments of the present invention have been made in view of the above-mentioned problems. Accordingly, preferred embodiments of the present invention provide a display device in which an image with a wide color reproduction range and bright red can be displayed.

In a transmissive liquid crystal display device including a display surface defined by pixels each having red, green, blue, and yellow sub-pixels, there is a lightness of each color (displayed color), first. According to a conventional four-primary-color transmissive liquid crystal display device including a display surface 500w constituted by pixels 11w each having a red sub-pixel 5Rw, a green sub-pixel 5Gw, a blue sub-pixel 5Bw, and a yellow sub-pixel 5Yw, which are the same in aperture area, as shown in FIG. 36, a lightness of each displayed color is as shown in Table 1. As shown in FIG. 37, according to a conventional three-primary-color transmissive liquid crystal display device including a display surface 500x constituted by pixels 11x each including a red sub-pixel 5Rx, a green sub-pixel 5Gx, and a blue sub-pixel 5Bx, which are the same in aperture area, as shown in FIG. 37, a lightness of each displayed color is as shown in Table 2.

TABLE 1

| Color | Red | Green | Blue | Yellow | Cyan | Magenta | White |
|---|---|---|---|---|---|---|---|
| Lightness | 11.0 | 33.4 | 7.6 | 48.0~92.4 | 43.4 | 18.6 | 100 |

TABLE 2

| Color | Red | Green | Blue | Yellow | Cyan | Magenta | White |
|---|---|---|---|---|---|---|---|
| Lightness | 23.8 | 66.1 | 10.0 | 89.9 | 76.1 | 33.8 | 100 |

Tables 1 and 2 show a lightness of each of six typical displayed colors: red; green; blue; yellow, cyan, and magenta. The lightness of each displayed color corresponds to a Y value in CIE 1931 (standard) calorimetric system (XYZ calorimetric system) and it is represented by a value relative to 100 of a lightness of white. In addition, a color filter is arranged in each sub-pixel of the transmissive liquid crystal display device. In any transmissive liquid crystal display device, a color filter having a spectral transmittance shown in FIG. 7 is preferably used. These transmissive liquid crystal display devices display an image using a backlight (light source is a cold cathode fluorescent tube (CCFT, CCFL)). Spectral characteristics of this light source are properly adjusted such that chromaticity coordinates of white preferably satisfy x=0.313 and y=0.329, and that and the color temperature is about 6500K. In Table 1, the lightness of yellow widely varies. This shows the following results. In the case where yellow is displayed using the yellow sub-pixel 5Yw and without lighting the red sub-pixel 5Rw and the green sub-pixel 5Gw, the lightness of yellow shows the smallest value (48.0). In the case where the red sub-pixel 5Rw and the green sub-pixel 5Gw as well as the yellow sub-pixel 5Yw are lighted to display yellow, the lightness of yellow shows the largest value (92.4). In the case where the red sub-pixel 5Rw, the green sub-pixel 5Gw, and the yellow sub-pixel 5Yw are lighted at a proper ratio to display yellow, the lightness of yellow shows a medium value.

From the results shown in Tables 1 and 2, it can be seen that in the conventional four-primary-color transmissive liquid crystal display device, the lightness of red, green, and blue are lower than those in the conventional three-primary-color transmissive liquid crystal display device. This is because an increase in a number of primary colors used for display increases the number of sub-pixels per pixel, and therefore an area of each sub-pixel is relatively decreased. That is, the number of primary colors used for display is increased from three to four, which decreases the area of each sub-pixel to ¾. Further, a visibility of green or blue is not deteriorated even if the lightness thereof is reduced, but red becomes darker by the reduction in lightness and the visibility of red is easily deteriorated.

FIG. 38 shows spectral characteristics of a light source used for display in a conventional four-primary-color transmissive liquid crystal display device. FIG. 9 shows spectral characteristics of a light source used for display in a conventional three-primary-color transmissive liquid crystal display device. According to the conventional four-primary-color transmissive liquid crystal display device, the pixel includes a yellow sub-pixel, in addition to red, green, and blue sub-pixels. Therefore, white with a yellow tinge is displayed if a light source having normal spectral characteristics shown in FIG. 9 is used. Accordingly, in order to adjust a color tone of white, a light source showing a high color temperature, which emits blue at a high intensity, as shown in FIG. 38, is used. For example, if a CCFT is used, blue light is emitted at a higher intensity, and green and red are emitted at a low intensity. In such a manner, the color temperature is increased. If a white light-emitting diode (LED) is used, a blue component is emitted at a higher intensity and a yellow component is emitted at a lower intensity, and thereby the color temperature is increased. Further, if red, green, and blue LEDs are used, green and red components are emitted at a low intensity and a blue component is emitted at a high intensity, as in the CCFT. As a result, the color temperature is increased. Thus, according to the conventional four-primary-color transmissive liquid crystal display device, the color temperature of the light source is increased in order to adjust the color tone of white. If the color temperature of the light source is increased, the yellow and red components of the light source need to be emitted at a lower intensity. As a result, the intensity of the red component of the light source is decreased.

As mentioned above, in the conventional four-primary-color transmissive liquid crystal display device, the increase in number of the primary colors used for display reduces particularly the lightness of red, and thereby the visibility is deteriorated. Further, if the light source having a high color temperature is used to adjust the color tone of white, the lightness of red is further reduced and this reduction further deteriorates the visibility. However, unlike in a conventional four-primary-color transmissive liquid crystal display device, a bright red can be displayed if the red sub-pixel has the largest aperture area in the pixel including the red, green, blue, and yellow sub-pixels, and as a result, the visibility can be improved.

Further, such operation and effects can be also obtained theoretically, not only in a transmissive display device including a display surface including pixels each having red, green, blue, and yellow sub-pixels, but also in a transmissive liquid crystal display device including a display surface including pixels each having a magenta sub-pixel, in addition to red, green, blue, and yellow sub-pixels. Furthermore, such operation and effects can be also obtained not only in transmissive liquid crystal display devices but also liquid crystal display devices in other display systems, such as reflective or transflective liquid crystal display devices, and the following various display devices such as, for example, cathode ray tube (CRT), organic electroluminescence display device (OELD), plasma display panel (PDP), and field emission displays (FEDs) such as, for example, a surface-conduction electron-emitter display (SED). As a result, the above-mentioned problems have been admirably solved, leading to completion of the present invention.

That is, preferred embodiments of the present invention provide a display device including a display surface, the display surface including a pixel having red, green, blue, and yellow sub-pixels, wherein the red sub-pixel has the largest aperture area (hereinafter, also referred to as "the first display device").

The first to twelfth preferred embodiments of display devices are mentioned below. The first to twelfth preferred embodiments of display devices according to the present invention are the same in that an image with a wide color reproduction range and bright red can be displayed. In this common point, the first to twelfth preferred embodiments of display devices according to the present invention are far superior to the conventional display devices.

According the first preferred embodiment of a display device of the present invention, a display surface is defined by pixels each including red, green, blue, and yellow sub-pixels. In the present description, the "pixel" means the minimum element on the display surface, and the pixels independently provide a color or a brightness to display an image. The "sub-pixel" means a point with a single color defining the pixel. The combination of the sub-pixels defining the pixel may not be the same among the pixels. For example, if sub-pixels of red, green, yellow, and two blues having different color characteristics (referred to as "the first blue" and "the second blue") are arranged, a pixel including sub-pixels of red, green, the first blue, and yellow and a pixel including sub-pixels of red, green, the second blue, and yellow may define the display surface. The pixel is defined by sub-pixels of a plurality of colors and displays a desired color using light including a combination of a plurality of colors. In preferred embodiments of the present invention, the pixel includes a yellow sub-pixel in addition to red, green, and blue sub-pixels. That is, according to the first display device according to preferred embodiments of the present invention, the number of primary colors used in displaying an image is larger than 3, and therefore it can display an image with a wider color reproduction range, in comparison to a display device which displays an image using three primary colors. The pixel may include a magenta sub-pixel, in addition to red, green, blue, and yellow sub-pixels, but it is preferable that the pixel includes only red, green, blue, and yellow sub-pixels in view of a transmittance of color filters in displaying white. If the pixel includes the magenta sub-pixel, the use efficiency of light of the color filter might not be enhanced because the magenta sub-pixel has a color filter with a low transmittance. In addition, even without the magenta sub-pixel, magenta with a high purity can be displayed by increasing the color purity of the red and blue sub-pixels. The pixel configuration (pixel pattern) is not especially limited. A stripe pattern, a diagonal pattern, a square pattern, and the like, may be mentioned.

The above-mentioned red sub-pixel has the largest aperture area. As mentioned above, if the red, green, blue, and yellow sub-pixels have the same aperture area, the reduction in lightness of red might deteriorate the visibility of the display device. According to a preferred embodiment of the present invention, the red sub-pixel has the largest aperture area in all of the sub-pixels, and therefore the lightness of red can be improved. As a result, the visibility of the display device can be improved. In the present description, the "aperture area" means an area of a region used for display (active region or effective region). Examples of a method which relatively increases an aperture area of the sub-pixel include (1) a method in which a proportion of an aperture area relative to an area of a sub-pixel is uniform among all of the sub-pixels, and a sub-pixel an aperture area of which is relatively increased has the largest aperture area among all of the sub-pixel; and (2) a method in which an area of a sub-pixel and a proportion of an aperture area relative to the area of the sub-pixel is uniform among all of the sub-pixels, and the number of a sub-pixel an aperture area of which is relatively increased is the largest. Method (1) is preferable in order not to complicate the structure. According to method (1), an increase in number of switching elements such as, for example, a thin film transistor (TFT) arranged to drive each sub-pixel can be minimized, for example. The lightness of red is preferably about 12% or more and more preferably about 15% or more relative to the lightness of white. If the lightness of red is larger than the lightness of white by about 30%, red seems to be emitted when white is displayed, which results in unnatural display. As a result, the visibility might be deteriorated. Accordingly, the lightness of red preferably accounts for about 30% or less relative to the lightness of white, and more preferably it accounts for about 25% or less.

If the respective sub-pixels are largely different in aperture area, the respective sub-pixels are largely different in pixel capacitance. That is, if the respective sub-pixels are largely different in aperture area, a charging rate, a drawing amount of a pixel potential by a gate signal, and a variation amount of a pixel potential by a source signal are largely different among the sub-pixels. As a result, defects such as flicker, image sticking, and cross talk might be generated. Accordingly, it is preferable that an aperture area of the red sub-pixel is about twice or less as large as an aperture area of a sub-pixel whose aperture area is the smallest. However, the above-mentioned defects might be eased by properly designing a size of the TFT, a storage capacitance, and the like, taking a difference in pixel capacitance into consideration. In this case, it is preferable that the aperture area of the red sub-pixel is about three times or less as large as an aperture area of a sub-pixel whose aperture area is the smallest.

The configuration of the first display device according to preferred embodiments of the present invention is not especially limited. The first preferred embodiment of a display device may or may not include other components as long as it includes, as a component, the above-mentioned display surface including the pixels each having the red, green, blue, and yellow sub-pixels. According to the first display device according to preferred embodiments of the present invention, the aperture area size relationship among sub-pixels in the pixel is not especially limited as long as the red sub-pixel has the largest aperture area and each of the sub-pixels other than the red sub-pixel has an aperture area smaller than that of the red sub-pixel.

It is preferable that the first display device according to preferred embodiments of the present invention performs display using a light source device such as, for example, a backlight and/or a front light. It is more preferable that the first display device according to preferred embodiments of the present invention is a transmissive liquid crystal display device which performs display using a backlight, a reflective liquid crystal display device which performs display using a front light, or a transflective liquid crystal display device which performs transmissive display using a backlight and performs reflective display using external light and/or a front light. According to this, even if the red sub-pixel has the largest aperture area, adjustment of spectral characteristics of the light source used for display easily permits optimization of the chromaticity of white displayed by the first display device. In the present description, the backlight is not especially limited, and it may be a direct or edge light type one. The light source is not especially limited. A white light-emitting diode (LED), an RGB-LED, a cold cathode fluorescent tube (CCFT), a hot cathode fluorescent tube (HCFT), an organic EL, and the like may be used.

In the present description, it is preferable that a filter which selectively transmits light having a specific wavelength (hereinafter, also referred to as a "color filter") is arranged in each sub-pixel. In this case, the color of the sub-pixel is determined based on spectral characteristics of the color filter. The material for the color filter is not especially limited. A resin which has been stained with a dye, a resin into which a pigment has been dispersed, a material prepared by solidifying a fluid material (ink) into which a pigment has been dispersed may be mentioned. The method for forming the color filter is not especially limited. Examples thereof include: a staining method, a pigment dispersion method, an electrodeposition method, a print method, an ink jet method, and a color resist method ("transfer method", "dry film laminating (DFL) method", or "dry film resist method").

In the present description, five colors of the sub-pixels are defined as follows. The "red" is a color having a dominant wavelength of about 595 nm or more and about 650 nm or less if chromaticity coordinates of a white point satisfies that x=0.3333 and y=0.3333 in the xy chromaticity diagram in the XYZ calorimetric system (CIE 1931 standard calorimetric system). The dominant wavelength is preferably about 600 nm or more and about 640 nm or less. The color purity of "red" is preferably about 75% or more and about 97% or less in view of subjective evaluation results. Evaluation results of the color purity range where an observer can recognize that natural red is displayed show that if the color purity of red is less than about 75%, red which is light in color and not bright might be displayed. On the other hand, if the color purity of red is more than about 97%, glare red like an emission color might be displayed, which gives unnatural red display. Similarly, the "green" is a color having a dominant wavelength of about 490 nm or more and less than about 555 nm or less, and preferably about 510 nm or more and about 550 nm or less. It is preferable that the "green" has a color purity of about 50% or more and about 80% or less from the same viewpoint. The "blue" is a color having a dominant wavelength of about 450 nm or more and about 490 nm or less, and preferably about 450 nm or more and about 475 nm or less. It is preferable that the "blue" has a color purity of about 50% or more and about 95% or less from the same viewpoint. The "yellow" is a color having a dominant wavelength of about 565 nm or more and less than about 580 nm or less, and preferably about 570 nm or more and about 580 nm or less. The color purity of "yellow" is preferably about 90% or more and about 97% or less from the same viewpoint. The "magenta" is a color having a complementary wavelength of about 495 nm or more and about 560 nm or less, and preferably a complementary wavelength of about 500 nm or more and about 555 nm or less. It is preferable that the "magenta" has a color purity of about 60% or more and about 80% or less from the same viewpoint. The dominant wavelength and the complementary wavelength generally represent a hue, and the color purity generally represents a chroma. The following method may be used as a method of measuring the color purity. Chromaticity coordinates of a color in each filter in the case that the light source which is actually used in the display device is used as a light source are measured with a spectroradiometer and the like. Then, the color purity is calculated based on chromaticity coordinates (0.3333, 0.3333) of a white point, the chromaticity coordinates of color in each filter, and chromaticity coordinates of a point where a line connecting the white point to the chromaticity point of the color in the filter intersects with a spectrum locus.

The first display device according to a preferred embodiment of the present invention is mentioned below in more detail.

It is preferable that the green, blue, and yellow sub-pixels have the smallest aperture area. That is, it is preferable that the green, blue, and yellow sub-pixels have the same and smallest aperture area. According to this preferred embodiment, the aperture areas of the green, blue, and yellow sub-pixels are equivalently small, and therefore the lightness of red can be improved.

It is preferable that the pixel includes a sub-pixel whose aperture area is smaller than an aperture area of the blue sub-pixel. Yellow, green, white, red, and blue are generally ranked in descending order of transmittance, with regard to a transmittance level relationship among the respective color filters arranged in the red, green, blue, and yellow sub-pixels, and the color filters for displaying white (an average transmittance of the color filters). In some cases, the red and blue are counterchanged, and yellow, green, white, blue, and red are ranked in descending order of transmittance. According to this relationship, the blue sub-pixel has the smallest aperture area and the aperture areas of the other sub-pixels can be increased. As a result, the transmittance of the color filters for displaying white can be increased. However, in this case, the color temperature of the light source used for display needs to be increased in order to maximize the chromaticity of white. If the color temperature of the light source is increased, the light-emitting efficiency of the light source is decreased. As a result, the lightness of white displayed by the display device is reduced with the decrease in the light-emitting efficiency of the light source. Accordingly, such a reduction in lightness of white displayed by the display device can be minimized if the blue sub-pixel does not have the smallest aperture area.

It is preferable that the green sub-pixel has the smallest aperture area. The transmittance level relationship among the color filters, the transmittance of the color filters for displaying white is reduced if the green sub-pixel has the smallest aperture area. However, in this case, the color temperature of the light source needs to be decreased in order to maximize the chromaticity of white. If the color temperature of the light source is decreased, the light-emitting efficiency of the light source is increased. As a result, the lightness of white displayed by the display device can be increased along with an increase in the light-emitting efficiency of the light source.

It is preferable that the yellow sub-pixel has the smallest aperture area. The transmittance level relationship among the color filters, the transmittance of the color filters for displaying white is reduced if the yellow sub-pixel has the smallest aperture area. However, in this case, the color temperature of the light source needs to be further decreased in order to maximize the chromaticity of white. If the color temperature is further reduced, the lightness of red can be further increased and the light-emitting efficiency of the light source can be further increased. As a result, the lightness of white displayed by the display device can be further increased with the increase in the light-emitting efficiency of the light source.

A preferred embodiment of the present invention provide a display device including a display surface, the display surface including a pixel having red, green, blue, and yellow sub-pixels, wherein the red and blue sub-pixels have the largest aperture area (hereinafter, also referred to as "the second display device"). According to this, the red and blue sub-pixels each of which has a color filter with a low transmittance have the largest aperture area. Therefore, the transmittance of the color filters for displaying white is reduced. However, in this case, the light-emitting efficiency of the light source needs to be further increased in order to maximize the chromaticity of white. As a result, the lightness of white displayed by the display device can be further improved with the increase of the light-emitting efficiency of the light source.

The configuration of a second display device according to a preferred embodiment of the present invention is not especially limited. The second display device may or may not include other components as long as it includes, as a component, the above-mentioned display surface including the pixels each having the red, green, blue, and yellow sub-pixels. According to the second display device according to a preferred embodiment of the present invention, the aperture area size relationship among the sub-pixels in the pixel is not especially limited as long as the red and blue sub-pixels have the same and largest aperture area and each of the sub-pixels other than the red and blue sub-pixels has an aperture area smaller than that of the red and blue sub-pixels. The pixel may include a magenta sub-pixel, in addition to red, green, blue, and yellow sub-pixels. However, it is preferable that the pixel includes only red, green, blue, and yellow sub-pixels in view of a transmittance of the color filters for displaying white.

The second display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the a second display device according to a preferred embodiment of the present invention performs display using a light source device such as, for example, a backlight and/or a front light, because of the same reason as mentioned in the first display device according to a preferred embodiment of the present invention. It is more preferable that the second display device according to a preferred embodiment of the present invention is one of a transmissive liquid crystal display device which performs display using a backlight, a reflective liquid crystal display device which performs display using a front light, or a transflective liquid crystal display device which performs transmissive display using a backlight and performs reflective display using external light and/or a front light.

The second display device according to a preferred embodiment of the present invention is described below in more detail.

The following preferred embodiments are embodiments in which the red and blue sub-pixels have the largest aperture area. (1A) A preferred embodiment in which in the pixel, each of the red and blue sub-pixels is the largest in number; (1B) a preferred embodiment in which in the above-mentioned (1A), the pixel includes blue sub-pixels different in color characteristics; (1C) a preferred embodiment in which in the above-mentioned (1A), the pixel includes red sub-pixels different in color characteristics; (1D) a preferred embodiment in which the green and yellow sub-pixels have the smallest aperture area; (1E) a preferred embodiment in which the green sub-pixel has the smallest aperture area; and (1F) a preferred embodiment in which the yellow sub-pixel has the smallest aperture area.

According to the above-mentioned preferred embodiment (1A), the aperture area of the respective sub-pixels is the same and therefore, common pixel and circuit designs can be adopted. In the present description, the above-mentioned "in the pixel, each of the red and blue sub-pixels is the largest in number" means that the number of the red sub-pixel defining a pixel and the number of the blue sub-pixel defining the pixel are the same and largest and that the number of each sub-pixel other than the red and blue sub-pixels is smaller than the number of each of the red and blue sub-pixels. According to the above-mentioned preferred embodiments (1B) and (1C), the color reproduction range can be further extended and the number of displayed color can be increased. In the present description, the phrase "different in color characteristics" means a difference in at least one of three attributes of color, i.e., hue, lightness, and chroma. In order to extend the color reproduction range with efficiency, the difference is a hue difference, preferably. According to the above-mentioned preferred embodiment (1D), the transmittance of the color filters for displaying white is decreased, but the transmittance of a blue component is relatively increased. Accordingly, a blue component of light with a low light-emitting efficiency can be reduced in order to maximize the chromaticity of white, and in such a case, the light-emitting efficiency of the light source is increased. As a result, the lightness of white displayed by the display device can be effectively improved with the increase in the light-emitting efficiency of the light source. According to the above-mentioned preferred embodiment (1E), the transmittance of the color filters for displaying white is reduced, but the transmittance of a blue component is relatively increased. Accordingly, a blue component of the light source with a low light-emitting efficiency can be reduced in order to maximize the chromaticity of white, and in such a case, the light-emitting efficiency of the light source is increased. As a result, the lightness of white displayed by the display device can be further improved with the increase in the light-emitting efficiency of the light source. According to the above-mentioned preferred embodiment (1F), the transmittance of the color filters for displaying white is further reduced, but the transmittance of a blue component is relatively increased, in comparison to the above-mentioned preferred embodiment (1E). Accordingly, a blue component of the light source with a low light-emitting efficiency can be reduced in order to maximize the chromaticity of white. If the blue component is reduced, the light-emitting efficiency of the light source is increased. As a result, the lightness of white displayed by the display device can be particularly improved with the increase in the light-emitting efficiency of the light source.

Preferred embodiments of the present invention also include a display device including a display surface, the display surface including a pixel having red, green, blue, and yellow sub-pixels, wherein the blue sub-pixel has the largest aperture area (hereinafter, also referred to as "the third display device"). According to this, the blue sub-pixel having the color filter with a low transmittance has the largest aperture area. Therefore, the transmittance of the color filters for displaying white is reduced. However, the color temperature of the light source needs to be decreased in order to maximize the chromaticity of white. If the color temperature of the light source is decreased, the lightness of red and the light-emitting efficiency of the light source can be increased. As a result, the lightness of white displayed by the display device can be improved with the increase in the light-emitting efficiency of the light source.

The configuration of a third display device according to a preferred embodiment of the present invention is not especially limited. The third display device may or may not include other components as long as it includes, as a component, the above-mentioned display surface including the pixels each having the red, green, blue, and yellow sub-pixels. According to the third display device according to a preferred embodiment of the present invention, the aperture area size relationship among the sub-pixels defining the pixel is not especially limited as long as the blue sub-pixel has the largest aperture area and each the sub-pixels other than the blue sub-pixel has an aperture area smaller than that of the blue sub-pixel. The pixel may include a magenta sub-pixel, in addition to the red, green, blue, and yellow sub-pixels. However, it is preferable that the pixel includes only the red, green, blue, and yellow sub-pixels in view of the transmittance of the color filters for displaying white.

The third display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the third display device according to a preferred embodiment of the present invention performs display using a light source device such as, for example, a backlight and/or a front light, because of the same reason as mentioned in the first display device according to a preferred embodiment of the present invention. It is more preferable that the third display device according to a preferred embodiment of the present invention is one of a transmissive liquid crystal display device which performs display using a backlight, a reflective liquid crystal display device which performs display using a front light, or a transflective liquid crystal display device which performs transmissive display using a backlight and performs reflective display using external light and/or a front light.

The following preferred embodiments are mentioned as the preferred embodiment in which the blue sub-pixel has the largest aperture area include: (2A) a preferred embodiment in which in the pixel, the blue sub-pixel is the largest in number; and (2B) a preferred embodiment in which in the above-mentioned (2A), the pixel includes blue sub-pixels different in color characteristics. According to the above-mentioned preferred embodiment (2A), the aperture area of the respective sub-pixels is the same, and therefore, common pixel and circuit designs can be adopted. According to the above-mentioned preferred embodiment (2B), the color reproduction range can be further extended and the number of displayed color can be increased.

Other preferred embodiments of the third display device of the present invention are mentioned below in more detail.

It is preferable that the red, green, and yellow sub-pixels have the smallest aperture area. That is, it is preferable that the red, green, and yellow sub-pixels have the same and the smallest aperture area. According to this, the aperture areas of the red, green, and yellow sub-pixels are equivalently small. Therefore, the transmittance of the color filters for displaying white is decreased, but the color temperature of the light source needs to be reduced in order to maximize the chromaticity of white. If the color temperature of the light source is reduced, the lightness of red can be effectively improved and the light-emitting efficiency of the light source can be increased. As a result, the lightness of white displayed by the display device can be increased with the increase in the light-emitting efficiency of the light source.

It is preferable that the pixel has a sub-pixel whose aperture area is smaller than an aperture area of the red sub-pixel. If the red sub-pixel has the smallest aperture area, the lightness of red is decreased. As a result, the visibility might be deteriorated. Accordingly, the red sub-pixel is arranged not to have the smallest aperture area, and thereby the reduction in lightness of red is minimized and the visibility can be secured.

It is preferable that the green and yellow sub-pixels have the smallest aperture area. That is, it is preferable that the above-mentioned green and yellow sub-pixels have the same and the smallest aperture area. According to this, the transmittance of the color filters for displaying white is decreased, but the transmittance of a blue component which passes through the color filter is relatively increased. Accordingly, a blue component of the light source with a low light-emitting efficiency can be reduced in order to maximize the chromaticity of white display. If the blue component is reduced, the light-emitting efficiency of the light source is increased. As a result, the lightness of white displayed by the display device can be improved with the increase in the light-emitting efficiency of the light source.

It is preferable that the green sub-pixel has the smallest aperture area. As shown in the above-mentioned transmittance level relationship among the color filters, if the green sub-pixel has the smallest aperture area, the transmittance of the color filters for displaying white is decreased, but the color temperature of the light source needs to be reduced in order to maximize the chromaticity of white. If the color temperature of the light source is reduced, the light-emitting efficiency of the light source is increased. As a result, the lightness of white displayed by the display device can be improved with the increase in the light-emitting efficiency of the light source.

It is preferable that the yellow sub-pixel has the smallest aperture area. As shown in the above-mentioned transmittance level relationship among the color filters, if the yellow sub-pixel has the smallest aperture area, the transmittance of the color filters for displaying white is decreased, but the color temperature of the light source needs to be reduced in order to maximize the chromaticity of white. If the color temperature of the light source is decreased, the lightness of red can be improved and also the light-emitting efficiency of the light source is further increased. Therefore, the transmittance of the color filters for displaying white is decreased, but the lightness of white displayed by the display device can be further improved with the increase in the light-emitting efficiency of the light source.

Preferred embodiments of the present invention further provide a display device including a display surface, the display surface including a pixel having red, green, blue, and yellow sub-pixels, wherein the yellow sub-pixel has the smallest aperture area (hereinafter, also referred to as "the fourth display device"). According to this, as shown in the transmittance level relationship among the color filters, the transmittance of the color filters for displaying white is decreased, but the color temperature of the light source needs to be reduced in order to maximize the chromaticity of white. If the color temperature is reduced, the lightness of red can be improved and the light-emitting efficiency of the light source can be increased. As a result, the lightness of white can be improved with the increase in the light-emitting efficiency of the light source.

The configuration of a fourth display device according to a preferred embodiment of the present invention is not especially limited. The fourth display device may or may not include other components as long as it includes, as a component, the above-mentioned display surface including the pixels each having the red, green, blue, and yellow sub-pixels. According to the fourth display device according to a preferred embodiment of the present invention, the relationship of the aperture area size among the sub-pixels in the pixel is not especially limited as long as the yellow has the smallest aperture area and each of the sub-pixels other than the yellow sub-pixel has an aperture area largest than the aperture area of the yellow sub-pixel. The pixel may include a magenta sub-pixel, in addition to the red, green, blue, and yellow sub-pixels. However, it is preferable that the pixel includes only the red, green, blue, and yellow sub-pixels in view of the transmittance in the color filters used for displaying white.

The fourth display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be included, for example. It is preferable that the fourth display device according to a preferred embodiment of the present invention performs display using a light source device such as, for example, a backlight and/or a front light, because of the same reason mentioned in the first display device according to a preferred embodiment of the present invention. It is more preferable that the fourth display device according to a preferred embodiment of the present invention is one of a transmissive liquid crystal display device which performs display using a backlight, a reflective liquid crystal display device which performs display using a front light, or a transflective liquid crystal display device which performs transmissive display using a backlight and performs reflective display using external light and/or a front light.

Preferred embodiments of the fourth display device of the present invention are described below in more detail.

It is preferable that the red, green, and blue sub-pixels have the largest aperture area. That is, it is preferable that the red, green, and blue sub-pixels have the same and largest aperture area. Thus, the red sub-pixel has a largest aperture area and the yellow sub-pixel has a small aperture area, and therefore, a light source with a high light-emitting efficiency can be used. Therefore, the lightness of red and white can be effectively improved. The following preferred embodiments are mentioned as the preferred embodiment in which the red, green, and blue sub-pixels have the largest aperture area: (3A) A preferred embodiment in which in the pixel, each of the red, green, and blue sub-pixels is the largest in number; (3B) a preferred embodiment in which the pixel includes blue sub-pixels different in color characteristics; and (3C) a preferred embodiment in which the pixel includes red sub-pixels different in color characteristics. According to any of the above-mentioned preferred embodiments (3A), (3B), and (3C), the aperture area of the respective sub-pixels is the same and therefore, common pixel and circuit designs can be adopted. According to the above-mentioned preferred embodiments (3B) and (3C), the color reproduction range can be further extended and the number of displayed color can be increased.

It is preferable that the pixel includes a sub-pixel whose aperture area is larger than an aperture area of the blue sub-pixel. According to the third display device according to a preferred embodiment of the present invention, the lightness of white displayed by the display device might be remarkably reduced. This is because the yellow sub-pixel having a color filter with a large transmittance has the smallest aperture area and because the blue sub-pixel having a color filter with a small transmittance has the largest aperture area. Accordingly, if the blue sub-pixel does not have the largest aperture area, such a reduction in lightness of white displayed by the display device can be minimized.

It is preferable that the red and green sub-pixels have the largest aperture area. That is, it is preferable that the red and green sub-pixels have the same and the largest aperture area. According to this, the red sub-pixel has the largest aperture area, and therefore the lightness of red can be improved. The red sub-pixel has the largest aperture area, and therefore, the color temperature of the light source needs to be increased in order to maximize the chromaticity of white. If the color temperature of the light source is increased, the light-emitting efficiency of the light source is reduced. However, according to preferred embodiments of the present invention, the green sub-pixel having a color filter with a large transmittance also has the largest aperture area. As a result, the reduction in lightness of white displayed by the display device can be minimized. The following preferred embodiments are mentioned as the preferred embodiment in which the red and green sub-pixels have the largest aperture area: (4A) A preferred embodiment in which in the pixel, each of the red and green sub-pixels is the largest in number; and (4B) a preferred embodiment in which the pixel includes green sub-pixels different in color characteristics. In both of the above-mentioned preferred embodiments (4A) and (4B), the aperture area of the respective sub-pixels is the same and therefore, common pixel and circuit designs can be adopted. According to the above-mentioned preferred embodiment (4B), the color reproduction range can be further extended and the number of displayed color can be increased.

Preferred embodiments of the present invention also include a display device including a display surface, the display surface including a pixel having red, green, blue, and yellow sub-pixels, wherein the red, blue, green, and yellow sub-pixels are ranked in descending order of aperture area (hereinafter, also referred to as "the fifth display device"). According to a fifth display device according to preferred embodiments of the present invention, the red sub-pixel has a large aperture area, and therefore, the effect of improving the lightness of red is large. In addition, the blue sub-pixel has a relatively large aperture area and the yellow sub-pixel has a small aperture area. Therefore, a light source having a high light-emitting efficiency can be used in order to maximize the chromaticity of white. Accordingly, the lightness of red can be improved at a relatively small aperture area ratio. As a result, the reduction in lightness of white can be preferably minimized.

The configuration of the fifth display device according to a preferred embodiment of the present invention is not especially limited. The fifth display device may or may not include other components as long as it includes, as a component, the above-mentioned display surface including the pixels each having the red, green, blue, and yellow sub-pixels. The pixel may include a magenta sub-pixel, in addition to the red, green, blue, and yellow sub-pixels. However, it is preferable that the pixel includes only the red, green, blue, and yellow sub-pixels in view of the transmittance of the color filters for displaying white.

The fifth display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the fifth display device according to a preferred embodiment of the present invention performs display using a light source device such as, for example, a backlight and/or a front light, because of the same reason mentioned with respect to the first display device according to a preferred embodiment of the present invention. It is more preferable that the fifth display device according to a preferred embodiment of the present invention is one of a transmissive liquid crystal display device which performs display using a backlight, a reflective liquid crystal display device which performs display using a front light, or a transflective liquid crystal display device which performs transmissive display using a backlight and performs reflective display using external light and/or a front light.

Preferred embodiments of the present invention further provide a display device including a display surface, the display surface including a pixel having red, green, blue, and yellow sub-pixels, wherein the red, blue, yellow, and green sub-pixels are ranked in descending order of aperture area (hereinafter, also referred to as "the sixth display device"). According to the sixth display device according to a preferred embodiment of the present invention, the red sub-pixel has a large aperture area, and therefore the effect of improving the lightness of red is large. In addition, the blue sub-pixel has a relatively large aperture area and the yellow sub-pixel has a relatively small aperture area. Therefore, a light having a high light-emitting efficiency can be used in order to maximize the chromaticity of white. As a result, the lightness of red can be improved at a relatively small aperture area ratio. As a result, the reduction in lightness of white can be preferably minimized.

The configuration of the sixth display device according to a preferred embodiment of the present invention is not especially limited. The sixth display device may or may not include other components as long as it includes, as a component, the above-mentioned display surface including the pixels each having the red, green, blue, and yellow sub-pixels. The pixel may include a magenta sub-pixel, in addition to red, green, blue, and yellow sub-pixels. However, it is preferable that the pixel includes only the red, green, blue, and yellow sub-pixels in view of the transmittance of the color filters for displaying white.

The sixth display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the sixth display device according to a preferred embodiment of the present invention performs display using a light source device such as, for example, a backlight and/or a front light, based on the same reason mentioned in the first display device according to a preferred embodiment of the present invention. It is more preferable that the sixth device according to a preferred embodiment of the present invention is one of a transmissive liquid crystal display device which performs display using a backlight; a reflective liquid crystal display device which performs display using a front light; or a transflective liquid crystal display device which performs transmissive display using a backlight and performs reflective display using external light and/or a front light.

Preferred embodiments of the present invention further include a display device including a display surface, the display surface including a pixel having red, green, blue, and yellow sub-pixels, wherein the red, green, blue, and yellow sub-pixels are ranked in descending order of aperture area (hereinafter, also referred to as "the seventh display device"). According to the seventh display device according to a preferred embodiment of the present invention, the red sub-pixel has a large aperture area, and therefore the effect of improving the lightness of red is large. In addition, the yellow sub-pixel has a small aperture area. Therefore, a light having a high light-emitting efficiency can be used in order to maximize the chromaticity of white. Accordingly, the lightness of red can be improved at a relatively small aperture area ratio. As a result, the reduction in lightness of white can preferably be minimized.

The configuration of the seventh display device according to a preferred embodiment of the present invention is not especially limited. The seventh display device may or may not include other components as long as it includes, as a component, the above-mentioned display surface including the pixels each having the red, green, blue, and yellow sub-pixels. The pixel may include a magenta sub-pixel, in addition to red, green, blue, and yellow sub-pixels. However, it is preferable that the pixel includes only the red, green, blue, and yellow sub-pixels in view of the transmittance of the color filters for displaying white.

The seventh display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the seventh display device according to a preferred embodiment of the present invention performs display using a light source device such as, for example, a backlight and/or a front light, based on the same reason mentioned in the first display device according to a preferred embodiment of the present invention. It is more preferable that the seventh display device according to a preferred embodiment of the present invention is one of a transmissive liquid crystal display device which performs display using a backlight; a reflective liquid crystal display device which performs display using a front light; or a transflective liquid crystal display device which performs transmissive display using a backlight and performs reflective display using external light and/or a front light.

Preferred embodiments of the present invention include a display device including a display surface, the display surface including a pixel having red, green, blue, and yellow sub-pixels, wherein the red, blue, and yellow and green sub-pixels are ranked in descending order of aperture area (hereinafter, also referred to as "the eighth display device"). The above-mentioned phrase "the red, blue, and yellow and green sub-pixels are ranked in descending order of aperture area" means that the red sub-pixel has the largest aperture area, and the yellow and green sub-pixels have the same and smallest aperture area, and the blue has an aperture area that is smaller than that of the red sub-pixel and larger than that of the yellow and green sub-pixels. According to an eighth display device according to a preferred embodiment of the present invention, the red sub-pixel has a large aperture area, and therefore the effect of improving the lightness of red is large. In addition, the blue sub-pixel has a relatively large aperture area, and the yellow and green sub-pixels have small aperture areas. Therefore, a light having a high light-emitting efficiency can be used in order to maximize the chromaticity of white. Accordingly, the lightness of red can be improved at a relatively small aperture area ratio. As a result, the reduction in lightness of white can be preferably minimized.

The configuration of the eighth display device according to a preferred embodiment of the present invention is not especially limited. The eighth display device may or may not include other components as long as it includes, as a component, the above-mentioned display surface including the pixels each having the red, green, blue, and yellow sub-pixels. The pixel may include a magenta sub-pixel of magenta, in addition to red, green, blue, and yellow sub-pixels. However, it is preferable that the pixel includes only red, green, blue, and yellow sub-pixels in view of the transmittance of the color filters for displaying white.

The eighth display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the eighth display device according to a preferred embodiment of the present invention performs display using a light source device such as, for example, a backlight and/or a front light, because of the same reason mentioned in the first display device according to a preferred embodiment of the present invention. It is more preferable that the eighth device according to a preferred embodiment of the present invention is one of a transmissive liquid crystal display device which performs display using a backlight; a reflective liquid crystal display device which performs display using a front light; or a transflective liquid crystal display device which performs transmissive display using a backlight and performs reflective display using external light and/or a front light.

Preferred embodiments of the present invention further provide a display device including a display surface, the display surface including a pixel having red, green, blue, and yellow sub-pixels, wherein the blue, red, green, and yellow sub-pixels are ranked in descending order of aperture area (hereinafter, also referred to as "the ninth display device"). According to a ninth display device according to a preferred embodiment of the present invention, the red sub-pixel has a relatively large aperture area, and therefore the effect of improving the lightness of red is large. In addition, the blue sub-pixel has a large aperture area and the yellow sub-pixel has a smallest aperture area. Therefore, a light source having a high light-emitting efficiency can be used in order to maximize the chromaticity of white. Accordingly, the lightness of red can be improved at a relatively small aperture area ratio. As a result, the reduction in lightness of white can be preferably minimized.

The configuration of the ninth display device according to a preferred embodiment of the present invention is not especially limited. The ninth display device may or may not include other components as long as it includes, as a component, the above-mentioned display surface including the pixels each having the red, green, blue, and yellow sub-pixels. The pixel may include a magenta sub-pixel of magenta, in addition to red, green, blue, and yellow sub-pixels. However, it is preferable that the pixel includes only red, green, blue, and yellow sub-pixels in view of the transmittance of the color filters for displaying white.

The ninth display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the ninth display device according to a preferred embodiment of the present invention performs display using a light source device such as, for example, a backlight and/or a front light, because of the same reason mentioned in the first display device according to a preferred embodiment of the present invention. It is more preferable that the ninth device of the present invention is one of a transmissive liquid crystal display device which performs display using a backlight; a reflective liquid crystal display device which performs display using a front light; or a transflective liquid crystal display device which performs transmissive display using a backlight and performs reflective display using external light and/or a front light.

Preferred embodiments of the present invention further include a display device including a display surface, the display surface including a pixel having red, green, blue, and yellow sub-pixels, wherein the blue, red, yellow, and green sub-pixels are ranked in descending order of aperture area (hereinafter, also referred to as "the tenth display device"). According to a tenth display device according to a preferred embodiment of the present invention, the red sub-pixel has a relatively large aperture area, and therefore the effect of improving the lightness of red is large. In addition, the blue sub-pixel has a large aperture area and the yellow sub-pixel has a relatively small aperture area. Therefore, a light source having a high light-emitting efficiency can be used in order to maximize the chromaticity of white. Accordingly, the lightness of red can be improved at a small aperture area ratio. As a result, the reduction in lightness of white can be preferably minimized.

The configuration of the tenth display device according to a preferred embodiment of the present invention is not especially limited. The tenth display device may or may not include other components as long as it includes, as a component, the above-mentioned display surface including the pixels each having red, green, blue, and yellow sub-pixels. The pixel may include a magenta sub-pixel of magenta, in addition to red, green, blue, and yellow sub-pixels. However, it is preferable that the pixel includes only red, green, blue, and yellow sub-pixels in view of the transmittance of the color filters for displaying white.

The tenth display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the tenth display device according to a preferred embodiment of the present invention performs display using a light source device such as, for example, a backlight and/or a front light, because of the same reason mentioned in the first display device according to a preferred embodiment of the present invention. It is more preferable that the tenth device of the present invention is one of a transmissive liquid crystal display device which performs display using a backlight; a reflective liquid crystal display device which performs display using a front light; or a transflective liquid crystal display device which performs transmissive display using a backlight and performs reflective display using external light and/or a front light.

Preferred embodiments of the present invention also include a display device including a display surface, the display surface including a pixel having red, green, blue, and yellow sub-pixels, wherein the blue, green, red, and yellow sub-pixels are ranked in descending order of aperture area (hereinafter, also referred to as "the eleventh display device"). According to an eleventh display device according to a preferred embodiment of the present invention, the yellow sub-pixel has a particularly small aperture area. Therefore, a red component can be emitted at a higher intensity from a backlight and the like, and in such a case, an effect of improving the lightness of red is large. In addition, the blue sub-pixel has a large aperture area and the yellow sub-pixel has a small aperture area. Therefore, a light source having a high light-emitting efficiency can be used in order to maximize the chromaticity of white. Accordingly, the lightness of red can be improved at a relatively small aperture area ratio. As a result, the reduction in lightness of white can be preferably minimized.

The configuration of the eleventh display device according to a preferred embodiment of the present invention is not especially limited. The eleventh display device may or may not include other components as long as it includes, as a component, the above-mentioned display surface including the pixels each having red, green, blue, and yellow sub-pixels. The pixel may include a magenta sub-pixel of magenta, in addition to red, green, blue, and yellow sub-pixels. However, it is preferable that the pixel includes only red, green, blue, and yellow sub-pixels in view of the transmittance of the color filters for displaying white.

The eleventh display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the eleventh display device according to a preferred embodiment of the present invention performs display using a light source device such as, for example, a backlight and/or a front light, based on the same reason mentioned in the first display device according to a preferred embodiment of the present invention. It is more preferable that the eleventh device of the present invention is one of a transmissive liquid crystal display device which performs display using a backlight; a reflective liquid crystal display device which performs display using a front light; or a transflective liquid crystal display device which performs transmissive display using a backlight and performs reflective display using external light and/or a front light.

Preferred embodiments of the present invention also include a display device including a display surface, the display surface including a pixel having red, green, blue, and yellow sub-pixels, wherein the blue and green, red, and yellow sub-pixels are ranked in descending order of aperture area (hereinafter, also referred to as "the twelfth display device"). The above-mentioned "the blue and green, red, and yellow sub-pixels are ranked in descending order of aperture area" means that the blue and green sub-pixels have the same and largest aperture area, and the yellow sub-pixel has the smallest aperture area, and the red sub-pixel has an aperture area smaller than the aperture areas of the blue and green sub-pixels and larger than the aperture area of the yellow sub-pixel. According to a twelfth display device according to a preferred embodiment of the present invention, the yellow sub-pixel has a particularly small aperture area. Therefore, a red component can be emitted at a higher intensity from a backlight and the like, and in such a case, an effect of improving the lightness of red is large. In addition, the blue sub-pixel has a large aperture area and the yellow sub-pixel has a small aperture area. Further, a light source having a high light-emitting efficiency can be used in order to maximize the chromaticity of white. Accordingly, the lightness of red can be improved at a relatively small aperture area ratio. As a result, the reduction in lightness of white can preferably be minimized.

The configuration of the twelfth display device according to a preferred embodiment of the present invention is not especially limited. The twelfth display device may or may not include other components as long as it includes, as a component, the above-mentioned display surface including the pixels each having red, green, blue, and yellow sub-pixels. The pixel may include a magenta sub-pixel of magenta, in addition to red, green, blue, and yellow sub-pixels. However, it is preferable that the pixel includes only red, green, blue, and yellow sub-pixels in view of the transmittance of the color filters for displaying white.

The twelfth display device according to a preferred embodiment of the present invention is not especially limited. A liquid crystal display device (LCD), a cathode ray tube (CRT), an organic electroluminescent display device (OELD), a plasma display panel (PDP), and a field emission display (FED) such as a surface-conduction electron-emitter display (SED) may be mentioned, for example. It is preferable that the twelfth display device according to a preferred embodiment of the present invention performs display using a light source device such as, for example, a backlight and/or a front light, because of the same reason mentioned in the first display device according to a preferred embodiment of the present invention. It is more preferable that the twelfth device according to a preferred embodiment of the present invention is one of a transmissive liquid crystal display device which performs display using a backlight; a reflective liquid crystal display device which performs display using a front light; or a transflective liquid crystal display device which performs transmissive display using a backlight and performs reflective display using external light and/or a front light.

According to display devices according to various preferred embodiments of the present invention, the pixel includes a sub-pixel for displaying yellow, in addition to sub-pixels for displaying red, green, and blue, respectively. The display device of the present invention performs display using more than three primary colors. Therefore, it can display an image with a wider color reproduction range in comparison to a display device which performs display using three primary colors. In addition, the sub-pixel for displaying red is the largest, and therefore the lightness of red can be improved.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

The present invention is mentioned in more detail below with reference to preferred embodiments, but it is not limited to only these preferred embodiments. Configurations and measurement values and the like in the following preferred embodiments are based on a simulation which is performed using a computer program. In the following preferred embodiments, a transmissive liquid crystal display device is exemplified to explain the present invention.

Preferred Embodiment 1

A configuration of a liquid crystal display device in accordance with preferred embodiment 1 of the present invention is mentioned below. The configuration of the liquid crystal display device of the present invention is not limited to this configuration.

Figure 1:
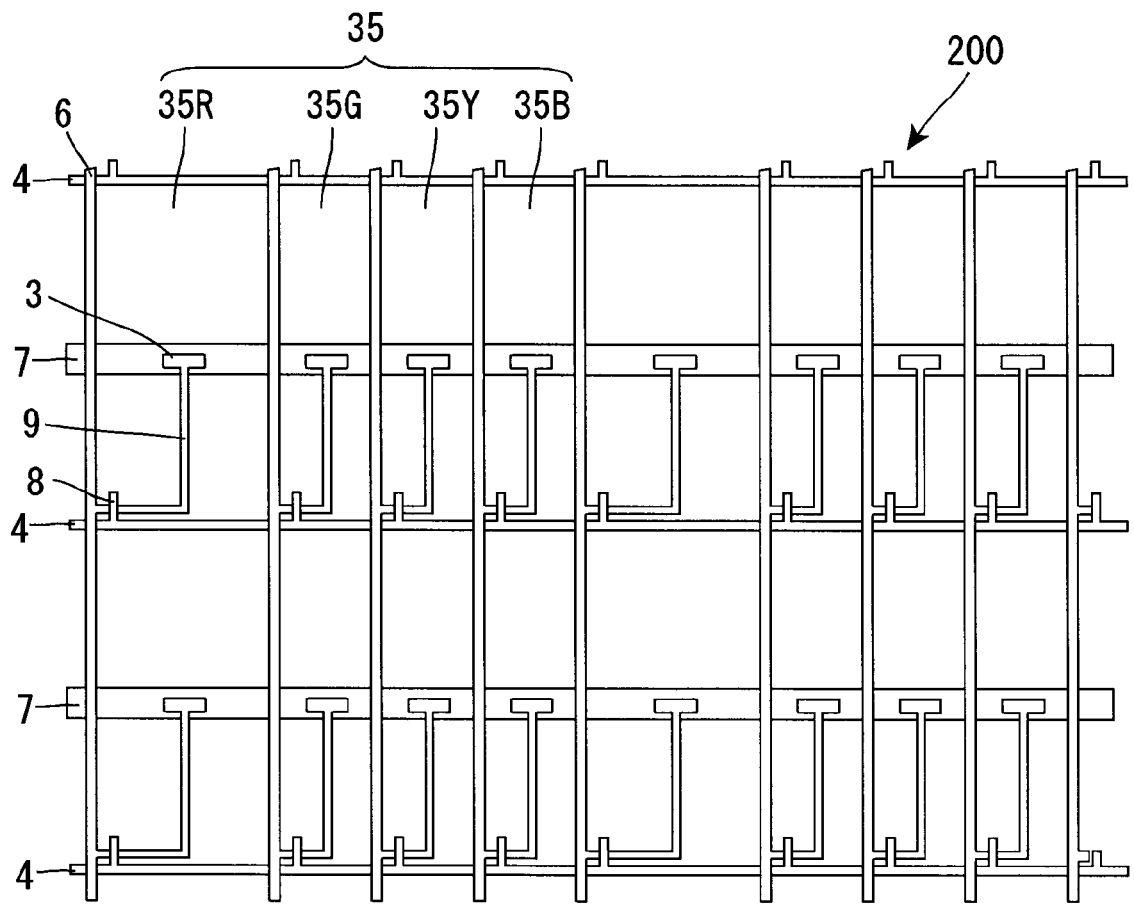
FIG. 1 is a planar view schematically showing the TFT substrate in the liquid crystal display device in accordance with a preferred embodiment 1 of the present invention.

FIG. 1 is a planar view schematically showing a configuration of a TFT substrate 200 in a transmissive liquid crystal display device in accordance with preferred embodiment 1 of the present invention. As shown in FIG. 1, the TFT substrate 200 has the following configuration. Matrix wirings defined by scanning lines 4 and signal lines 6 are arranged on a glass substrate, for example. In each intersection of the matrix wirings, a thin film transistor (TFT) 8 is arranged. In each region surrounded by the matrix wirings, a transmissive electrode 35 (including transmissive electrodes 35R, 35G, 35Y, and 35B) made of a transparent conductive material such as indium tin oxide (ITO) is arranged. A gate electrode of the TFT 8 is connected to the scanning line 4, and a source electrode of the TFT 8 is connected to the signal line 6. The drain electrode of the TFT 8 is connected to the transmissive electrode 35 through a drain-extracting wiring 9. The transmissive electrodes 35R, 35G, 35Y, and 35B are arranged to oppose a red color filter 10R, a green color filter 10G, a blue color filter 10B, and a yellow color filter 10Y, respectively. The red, green, blue, and yellow color filters 10R, 10G, 10B, and 10Y are arranged in the below-mentioned color filter substrate 11 of the liquid crystal display device. According to the present preferred embodiment, as shown in FIG. 1, the scanning line 4 and the signal line 6 are arranged in such a way that the transmissive electrode 35R opposing the red color filter 10R is large and the transmissive electrodes 35G, 35Y, and 35R opposing the other color filters are equivalently small. A storage capacitor wiring 7 is arranged in parallel to the scanning line 4 to maintain a voltage applied to the transmissive electrode 35. The storage capacitor wiring 7 opposes the end of the drain-extracting wiring 9 with an insulating film therebetween to define a storage capacitance 3.

Figure 2:
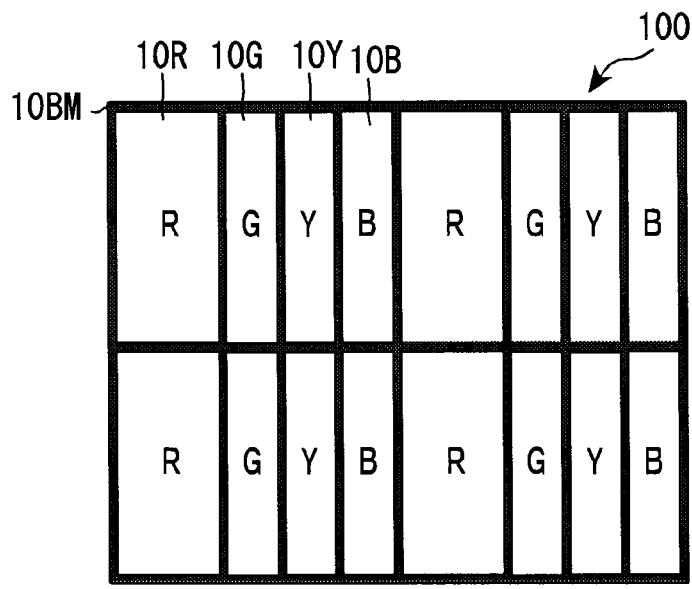
FIG. 2 is a planar view schematically showing the counter substrate in the liquid crystal display device in accordance with preferred embodiment 1 of the present invention.

FIG. 2 is a planar view schematically showing a configuration of the color filter substrate (counter substrate) 100 in the transmissive liquid crystal display device in accordance with preferred embodiment 1 of the present invention.

According to the color filter substrate 100, as shown in FIG. 2, the red color filter 10R, the green color filter 10G, the yellow color filter 10Y, and the blue color filter 10B are arranged in a stripe pattern in this order, and a black matrix 10BM is arranged around each filter and between the filters. Each of the color filters 10R, 10G, 10B, and 10Y selectively transmits light. The red color filter 10R mainly transmits a red component of incident light. The green color filter 10G mainly transmits a green component of incident light. The blue color filter 10B mainly transmits a blue component of incident light. The yellow color filter 10Y mainly transmits both of a red component and a green component of incident light. In the present preferred embodiment, as shown in FIG. 2, the color filters 10R, 10B, 10G, and 10Y are arrayed in the same pattern among all of the pixels, but may be arrayed in a different pattern among the pixels. The configuration of the pixel in the present invention is not especially limited. The color filters 10R, 10B, 10G, and 10R are arranged to oppose the transmissive electrodes 35R, 35G, 35Y, and 35B, respectively, arranged in the above-mentioned TFT substrate 200 of the liquid crystal display device. The black matrix 10BM is arranged to oppose the scanning line 4 and the signal line 6 in the liquid crystal display device. According to the present preferred embodiment, as shown in FIG. 2, the area of the red color filter 10R is large, and other color filters 10B, 10G, and 10Y are equivalently small.

Figure 3:
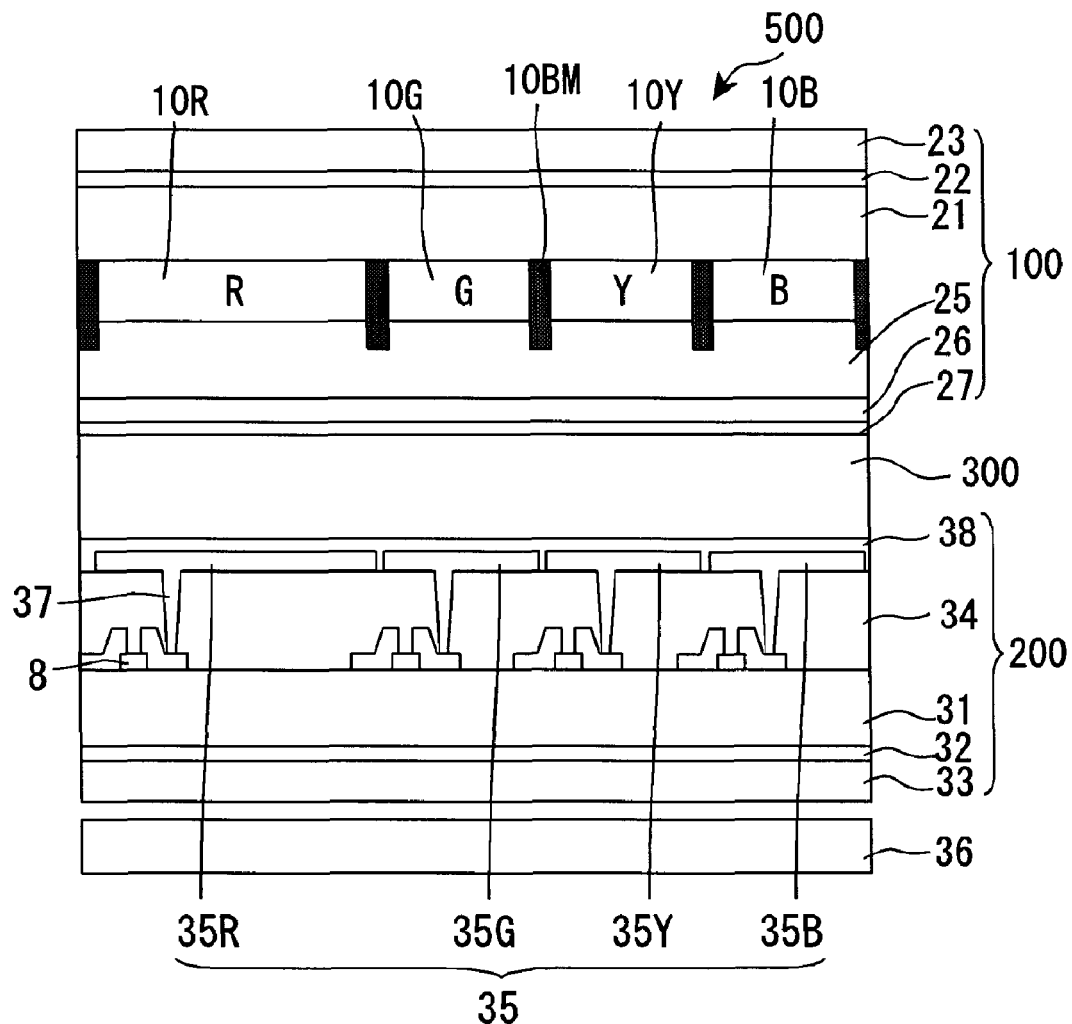
FIG. 3 is a cross-sectional view schematically showing the liquid crystal display device in accordance with preferred embodiment 1 of the present invention.

FIG. 3 is a cross-sectional view schematically showing the transmissive liquid crystal display device in accordance with preferred embodiment 1 of the present invention.

As shown in FIG. 3, a transmissive liquid crystal display device 500 in accordance with preferred embodiment 1 of the present invention includes a liquid crystal layer 300 between the above-mentioned color filter substrate 100 and the above-mentioned TFT substrate 200. The color filter substrate 100 includes a retarder 22 and a polarizer 23 on an outer surface side (observation surface side) of the glass substrate 21, and further includes the red color filter 10R, the green color filter 10G, the blue color filter 10B, and the yellow color filter 10Y, the black matrix 10BM, and an overcoat layer 25, a counter electrode 26, and an alignment film 27 on an inner surface side (back surface side) of the glass substrate 21.

The retarder 22 adjusts a polarization state of light which passes through the retarder 22. The polarizer 23 transmits only light having a specific polarization component. According to the present preferred embodiment, the arrangement and configuration of the retarder 22 and the polarizer 23 are adjusted in such a way that the retarder 22 and the polarizer 23 function as circular polarizers.

The overcoat layer 25 prevents elution of a contaminant from the red, green, blue, and yellow filters 10R, 10G, 10B, and 10Y into the liquid crystal layer 300. Further, the overcoat layer 25 flattens the surface of the color filter substrate 100. The counter electrode 26 opposes the transparent electrodes 35R, 35G, 35B, and 35Y arranged on the TFT substrate 200 side with the liquid crystal layer 300 therebetween. The counter electrode 26 is used to drive liquid crystal molecules by applying a voltage to the liquid crystal layer 300. The counter electrode 26 is made of a transparent conductive material such as, for example, indium tin oxide (ITO). The alignment film 27 controls alignment of liquid crystal molecules in the liquid crystal layer 300.

The TFT substrate 200 includes a retarder 32 and a polarizer 33 on an outer surface side (back surface side) of the glass substrate 31, and further includes the thin film transistor (TFT) 8, an interlayer insulating film 34, the transparent electrode 35 (defined of the transparent electrodes 35R, 35G, 35B, and 35Y), and an alignment film 38 on an inner surface side (observation surface side) of the glass substrate 31.

The retarder 32 adjusts a polarization state of light which passes through the retarder 32, similarly to the retarder 22. The polarizer 33 transmits only light having a specific polarization component, similarly to the polarizer 23. According to the present preferred embodiment, this polarizer 33 is arranged to be optically perpendicular or substantially optically perpendicular to the circular polarizer arranged on the color filter substrate 100 side.

The transparent electrode 35 (defined of the transparent electrodes 35R, 35G, 35B, and 35Y) is arranged in each color filter on the color filter substrate 100 side. In each color filter region, a voltage is applied to the liquid crystal layer 300 to drive liquid crystal molecules. The alignment film 38 controls alignment of the liquid crystal molecules in the liquid crystal layer 300, similarly to the alignment film 27.

Figure 4:
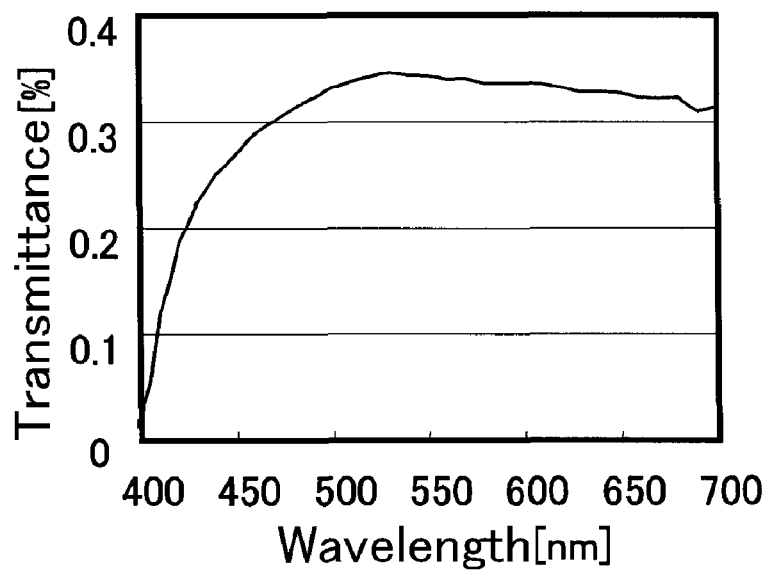
FIG. 4 is a view showing spectral transmittance characteristics of a liquid crystal layer.

On the rear surface side (back surface side) of the TFT substrate 200, a backlight 36 is arranged to be used for display. Spectral characteristics and the like of a light source of the backlight 36 are mentioned below. FIG. 4 is a view showing spectral characteristics of the liquid crystal layer 300. According to the present preferred embodiment, a nematic liquid crystal with a negative dielectric anisotropy is used as a material for the liquid crystal layer 300.

Figure 5:
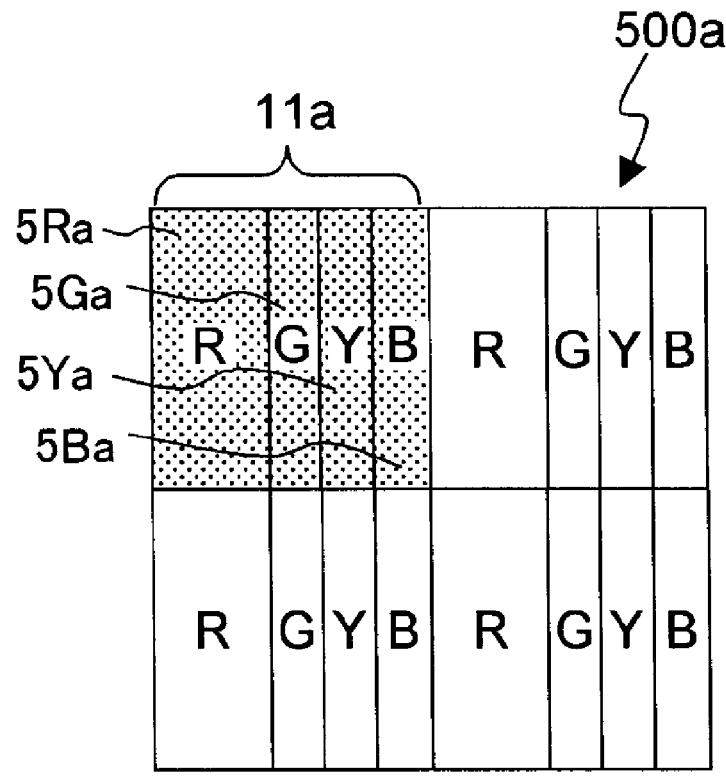
FIG. 5 is a planar view schematically showing a display surface of the liquid crystal display device in accordance with preferred embodiment 1 of the present invention.

FIG. 5 is a planar view schematically showing a configuration of the pixel of the liquid crystal display device 500 in accordance with preferred embodiment 1 of the present invention. According to the present preferred embodiment, the liquid crystal display device 500 has the above-mentioned configuration. Therefore, as shown in FIG. 5, the red sub-pixel 5Ra has the largest aperture area. The green, blue, and yellow sub-pixels 5Ga, 5Ba, and 5Ya are equivalently small. Such a preferred embodiment is mentioned below. The aperture area means an area of a region which is actually used in displaying an image, and it does not include an area of a region which is shielded by the thin film transistors (TFT) 8, the scanning lines 4, the signal lines 6, and storage capacitances 3, and black matrixes 10BM. The liquid crystal display device 500 in accordance with the present preferred embodiment includes a plurality of pixels 11a arrayed in a matrix pattern. The shaded portion in FIG. 5 corresponds to one pixel. In FIG. 5, four pixels among the plurality of pixels 11a defining the display surface 500a in the liquid crystal display device 500 are shown.

Figure 6:
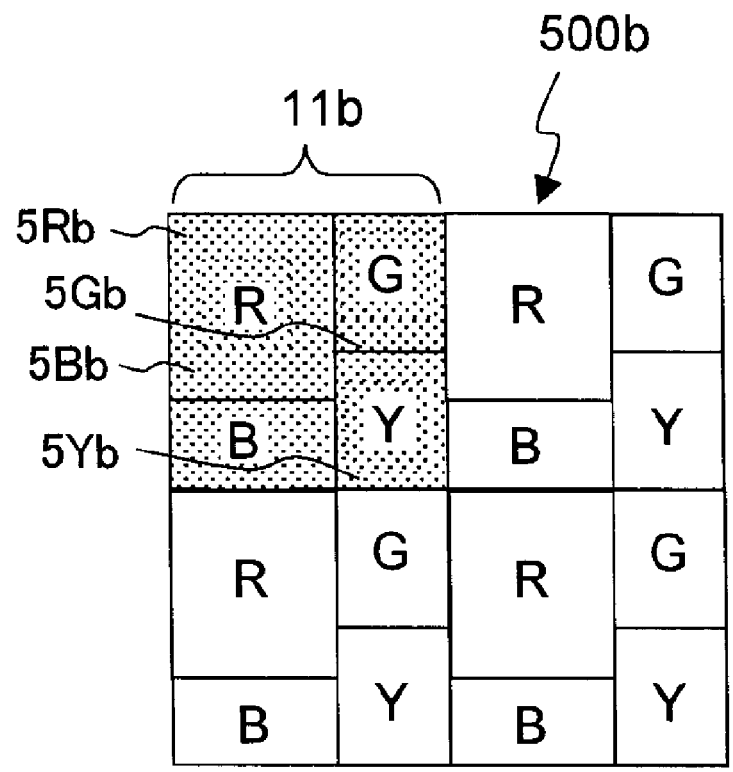
FIG. 6 is a planar view schematically showing a display surface of the liquid crystal display device in accordance with preferred embodiment 1 of the present invention.

As shown in FIG. 5, the pixel 11a is defined by a plurality of sub-pixels. According to the present preferred embodiment, the four sub-pixels defining the pixel 11a are a sub-pixel 5Ra for displaying red, a sub-pixel 5Ga for displaying green, and a sub-pixel 5Ba for displaying blue, and a sub-pixel 5Ya for displaying yellow. FIG. 5 shows a configuration in which these four sub-pixels are arranged in one row and four columns in the pixel 11a. FIG. 6 shows another configuration of a pixel defining a screen surface 500b of the liquid crystal display device and shows a configuration in which four sub-pixels 5Rb, 5Gb, 5Bb, and 5Yb are arranged in two rows and two columns in the pixel 11b. According to the present preferred embodiment, the array of the red, green, blue, and yellow sub-pixels is not especially limited to the arrays shown in FIGS. 5 and 6. Attributed to the aperture area ratio among the respective sub-pixels, the effects can be obtained.

Six liquid crystal display devices A1 to A6 shown in Table 3 are prepared in this preferred embodiment. In each of these liquid crystal display devices A1 to A6, the red sub-pixel is different in aperture area from the other sub-pixels. Specifically, the aperture area of the red sub-pixel is the largest and the aperture areas of the green, blue, and yellow sub-pixels are equivalently small.

TABLE 3

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| A1 | 11:9.7:9.7:9.7 | 1.13 | 12.3 | 97.7 | 39.6 | 0.78 |
| A2 | 12:9.3:9.3:9.3 | 1.29 | 12.9 | 96.0 | 38.7 | 0.79 |
| A3 | 13:9:9:9 | 1.44 | 13.4 | 93.3 | 37.7 | 0.78 |
| A4 | 14:8.7:8.7:8.7 | 1.61 | 14.2 | 91.0 | 36.8 | 0.78 |
| A5 | 15:8.3:8.3:8.3 | 1.81 | 14.9 | 88.6 | 35.8 | 0.78 |
| A6 | 16:8:8:8 | 2.00 | 15.6 | 86.1 | 34.7 | 0.78 |

Figure 7:
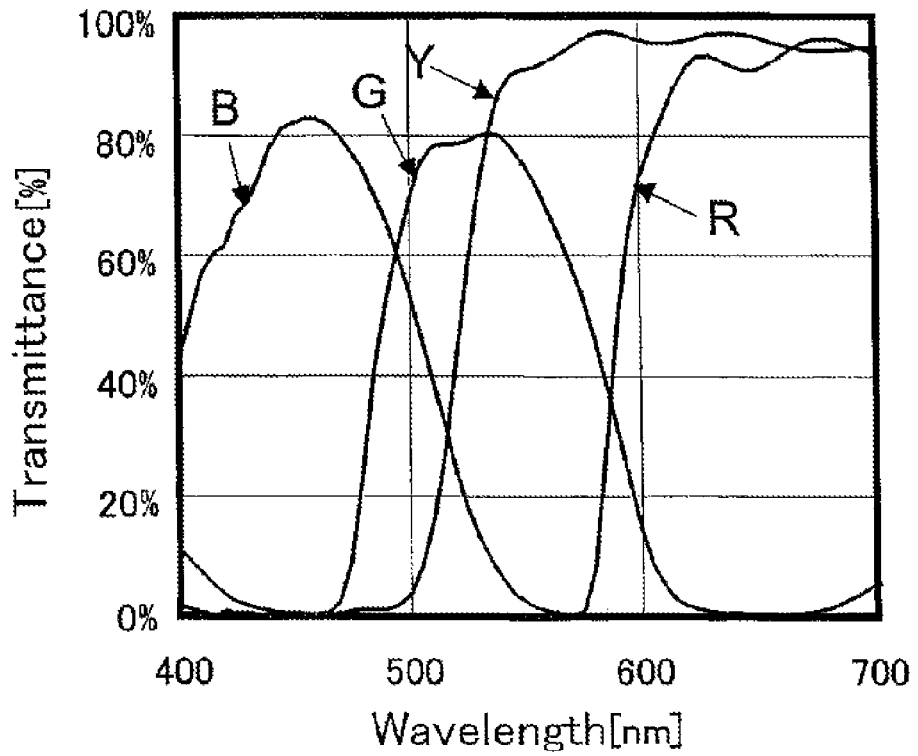
FIG. 7 is a diagram showing spectral transmittance characteristics of the color filters.
Figure 8:
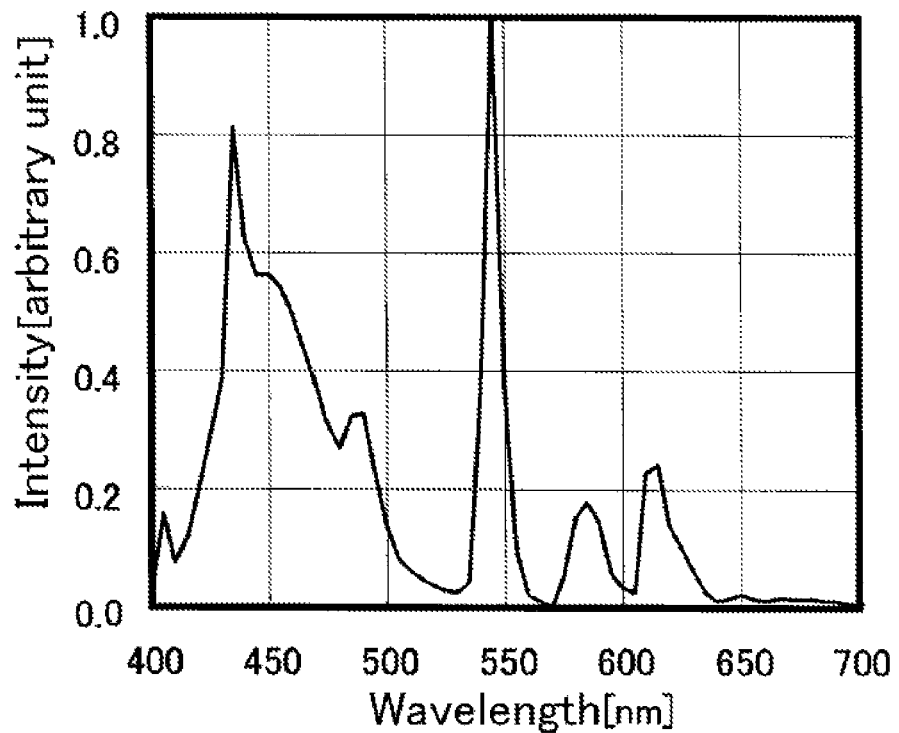
FIG. 8 is a diagram showing spectral characteristics of a light source of a back light, used in the liquid crystal display device (the liquid crystal display device A6 in Table 3) in accordance with preferred embodiment 1 of the present invention.
Figure 9:
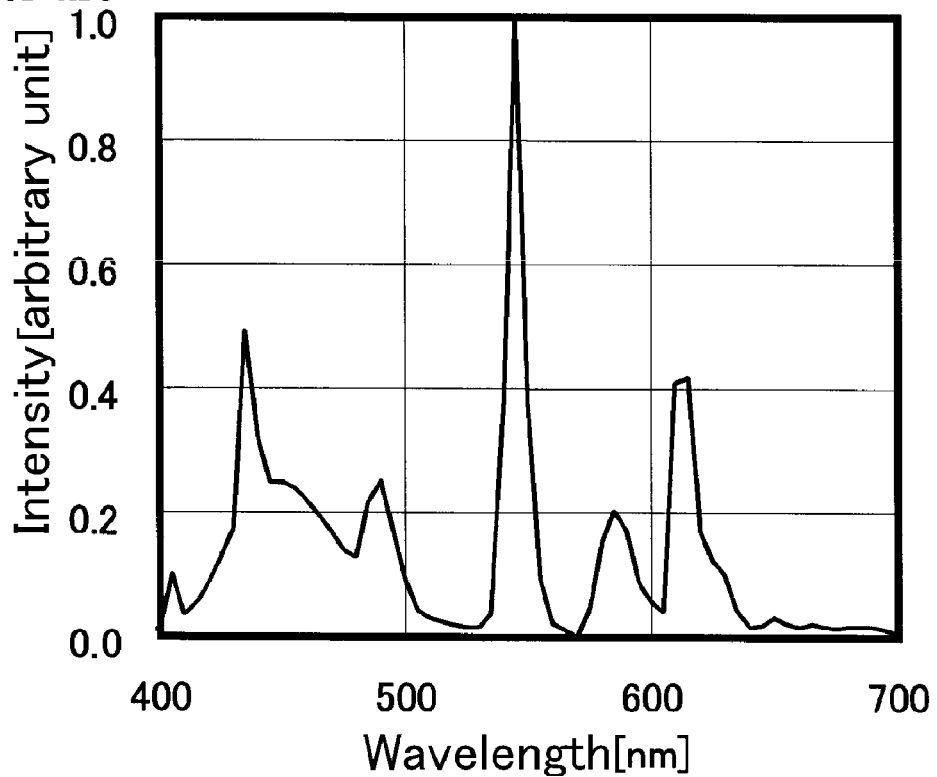
FIG. 9 is a diagram showing spectral characteristics of a light source of a backlight, used in a conventional three-primary-color liquid crystal display device.

In all of the liquid crystal display devices A1 to A6, a color filter having a spectral transmittance shown in FIG. 7 is used. The aperture area ratio among the sub-pixels varies depending on the liquid crystal display devices, and therefore, the chromaticity of white displayed by the color filter also varies depending on the liquid crystal display devices. In the present preferred embodiment, in order to obtain a desired chromaticity of white, a spectrum of a light source of the backlight 36 is adjusted in each liquid crystal display device. Specifically, spectral characteristics of the light source of the backlight 36 used in the liquid crystal display devices A1 to A6 are properly adjusted in such a way that white displayed by the liquid crystal display device shows chromaticity coordinates: x=0.313; and y=0.329 and that the color temperature is about 6500K. A cold cathode fluorescent tube (CCFT) is used as the light source of the backlight 36, for example. The mixing ratio among red, green, and blue fluorescent materials is varied to adjust spectral characteristics of the light source. Spectral characteristics of the light source of the backlight 36 used in the liquid crystal display device A6 in Table 3 are shown in FIG. 8, as one example.

Figure 38:
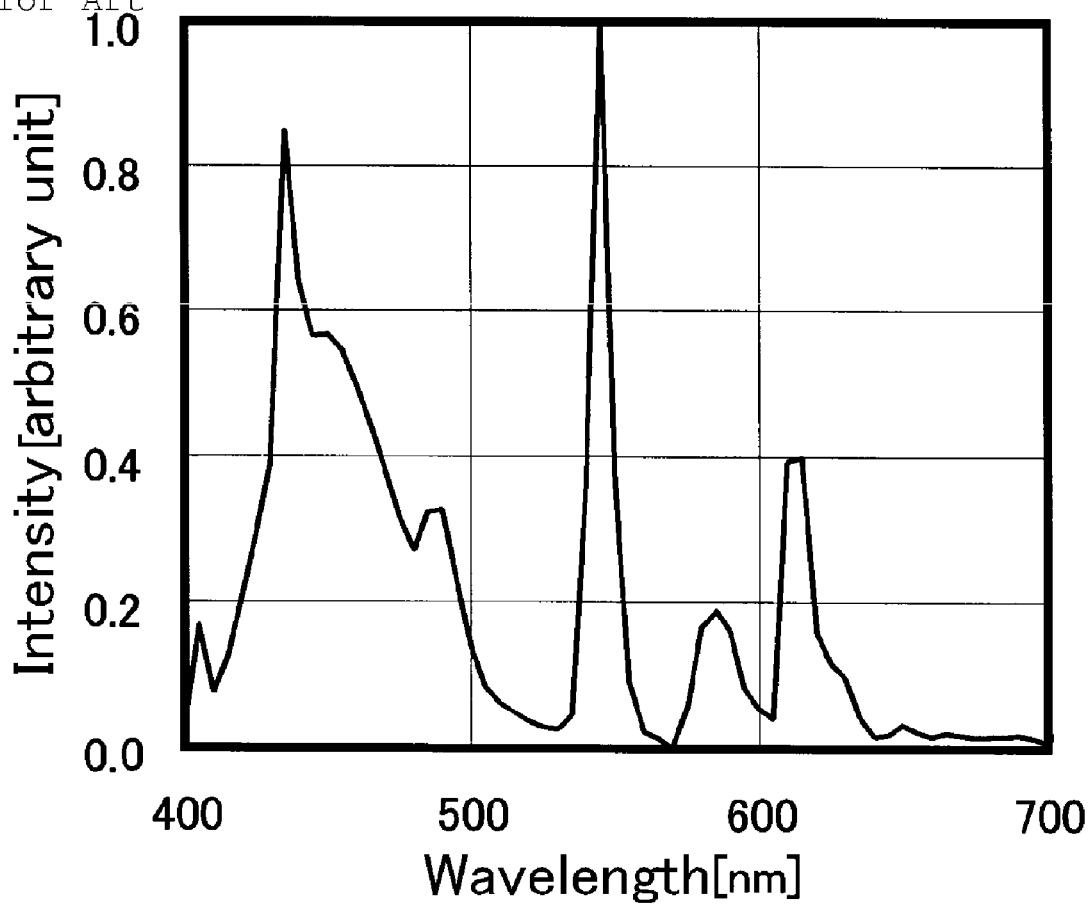
FIG. 38 is a diagram showing spectral characteristics of a light source of a backlight used in a conventional four-primary-color display device.

Table 3 shows an aperture area ratio among the respective sub-pixels, an aperture area ratio between the sub-pixel having the largest aperture area (red sub-pixel) and the sub-pixel having the smallest aperture area (green, blue, or yellow sub-pixel), a lightness of red, a lightness of white, an average transmittance of the color filters, and a light-emitting efficiency of the light source of the backlight, in the liquid crystal display devices A1 to A6. The lightness of red is a value relative to 100 of a lightness Y of white in each liquid crystal display device (a ratio relative to the lightness of white). The lightness of white is a value relative to 100 of a lightness of white displayed by the following conventional four-primary-color liquid crystal display device (shown in FIG. 36). According to the conventional four-primary-color liquid crystal display device, the sub-pixels of the respective colors have the same aperture area, a color filter having a spectral transmittance shown in FIG. 7 is used, and a CCFT having spectral characteristics shown in FIG. 38 is used as a light source of the backlight 36. Further, the average transmittance of the color filters is an average value of transmittances in the respective color filters used for displaying white using the light source of the backlight 36 arranged in each liquid crystal display device. The light-emitting efficiency of the light source of the backlight 36 is determined as follows. First, a light-emitting efficiency of a red fluorescent material used in a CCFT (light source), a light-emitting efficiency of a green fluorescent material used in a CCFT (light source), and a light-emitting efficiency of a blue fluorescent material used in a CCFT (light source) are individually measured. Then, on the basis of these measurement values, the mixing ratio among the red, green, and blue fluorescent materials is varied. Under such a condition, the light-emitting efficiency in the case where red, green, and blue are combined is calculated. The light-emitting efficiency of the light source of the backlight 36 is a ratio between a light-emitting efficiency in the case where red, green, and blue are combined, and a light-emitting efficiency in the case where red, green, and blue are combined in the conventional three-primary-color display device.

Figure 10:
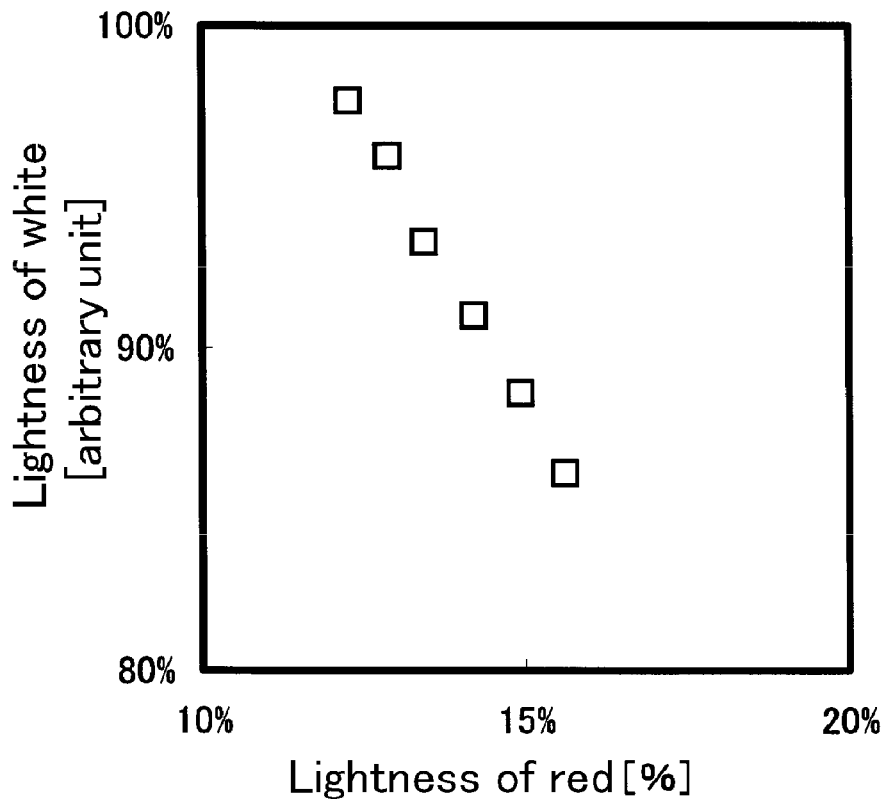
FIG. 10 is a diagram showing a relationship between a lightness of red and a lightness of white displayed by the liquid crystal display device in accordance with preferred embodiment 1 of the present invention.

FIG. 10 is a diagram showing a relationship between a lightness of red and a lightness of white displayed by the liquid crystal display devices A1 to A6 prepared in the present preferred embodiment.

According to the liquid crystal display devices A1 to A6 in the present preferred embodiment, the red sub-pixel has the largest aperture area. Therefore, the lightness of red can be more improved and brighter red can be displayed in comparison to the conventional four-primary-color liquid crystal display device (Table 1) shown in FIG. 36. That is, red with excellent visibility can be displayed. An appropriate one among these liquid crystal display devices A1 to A6 may be selected depending on an application and the like.

According to the present preferred embodiment, a common CCFT is used as a light source of the backlight 36. The chromaticity of white is adjusted by varying only the mixing ratio among the red, green, and blue fluorescent materials. The lightness of white displayed by the liquid crystal display device is calculated, also taking the variation of the light-emitting efficiency, in the case that in the light source of the backlight, the mixing ratio among the fluorescent materials of the respective colors is varied, into consideration. That is, the lightness of white is the lightness in the liquid crystal display device, taking not only an average transmittance (efficiency) of the color filters but also the light-emitting efficiency of the light source of the back light 36 into consideration. In the preferred embodiments of the present invention, the chromaticity of white is set to the above-mentioned value, but it is not limited thereto. The same effect can be obtained if the chromaticity of white is appropriately adjusted to an optimal chromaticity.

Figure 11:
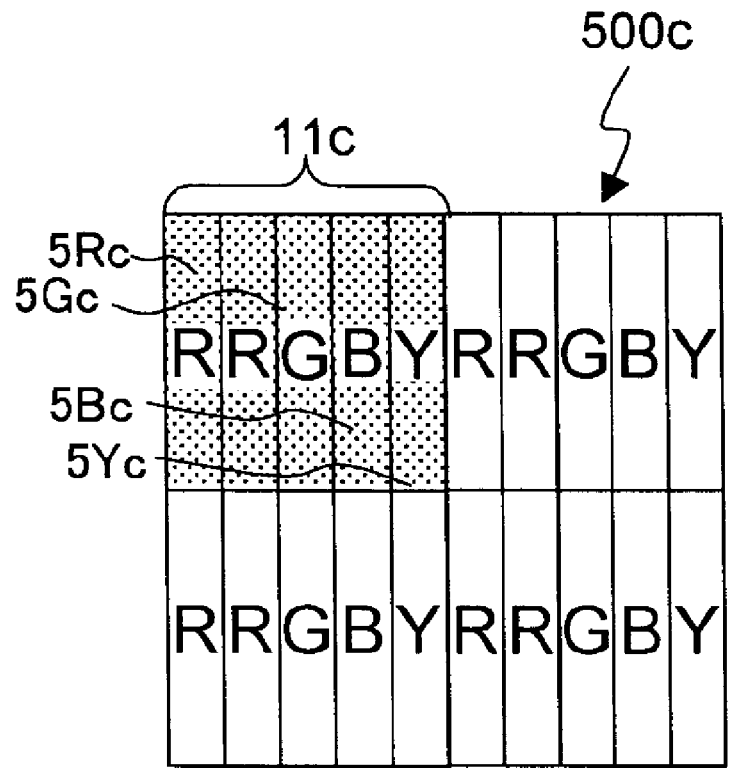
FIG. 11 is a view schematically showing a modified example of the display surface of the liquid crystal display device in accordance with preferred embodiment 1 of the present invention.

The pixel configuration of the liquid crystal display device in the present preferred embodiment is not limited to those shown in FIGS. 5 and 6. For example, as shown in FIG. 11, the liquid crystal display device in the present preferred embodiment may have a configuration in which a pixel 11c defining a display surface 500c is divided into five sub-pixels and two red sub-pixels are arranged. In FIG. 11, with regard to the aperture area ratio among the red sub-pixel 5Rc, the green sub-pixel 5Gc, the blue sub-pixel 5Bc, and the yellow sub-pixel 5Yc, red:green:blue:yellow is 2:1:1:1. Thus, a plurality of red sub-pixels are arranged, and thereby an amount of modification of the pixel design and the driving circuit design can be minimized.

Figure 12:
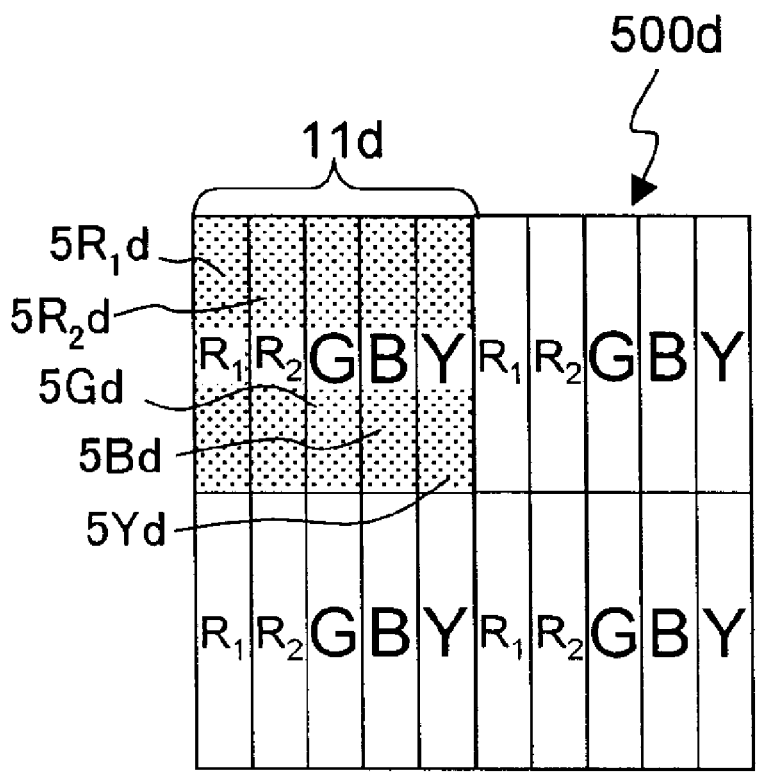
FIG. 12 is a view schematically showing a modified example of the display surface of the liquid crystal display device in accordance with preferred embodiment 1 of the present invention.
Figure 13:
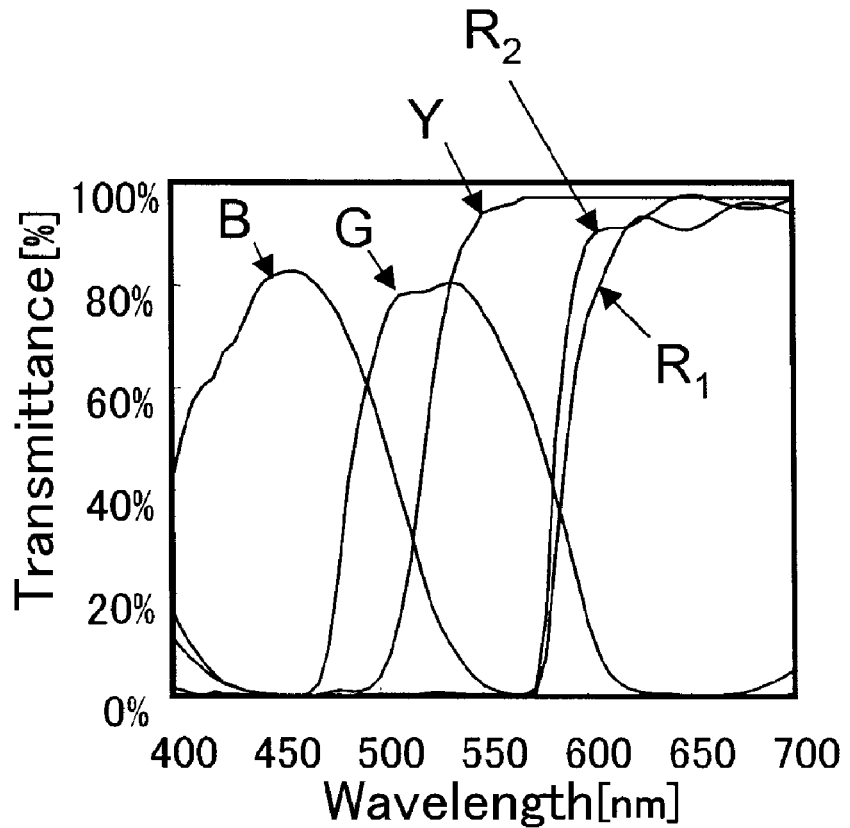
FIG. 13 is a diagram showing spectral transmittance characteristics of the color filters.

As shown in FIG. 12, the liquid crystal display device in the present preferred embodiment may have a configuration in which a pixel 11d defining a display surface 500d is divided into five sub-pixels, and two red sub-pixels having different color characteristics are arranged. Spectral characteristics of the color filters are shown in FIG. 13. In this case, light having a dominant wavelength of about 612 nm passes through a red sub-pixel 5R$_1$d, and light having a dominant wavelength of about 607 nm passes through a red sub-pixel 5R$_2$d. Also in the case shown in FIG. 12, the aperture areas of the red sub-pixels 5R$_1$d and 5R$_2$d, the green sub-pixel 5Gd, the blue sub-pixel Bd, and the yellow sub-pixel 5Yd are equivalent. With regard to the aperture area ratio among the respective sub-pixels, red:green:blue:yellow is 2:1:1:1. Thus, the two red sub-pixels having different color characteristics are arranged, and thereby the color reproduction range can be further extended.

These pixel configurations are just mentioned as one example, and the present preferred embodiment is not limited to these pixel configurations.

Preferred Embodiment 2

With regard to a transmittance level relationship among the respective color filters arranged in the red, green, blue, and yellow sub-pixels, and a transmittance of the color filters for displaying white (an average transmittance of the red, green, blue, and yellow sub-pixels), yellow, green, white, red, and blue are ranked in descending order of transmittance. In some cases, the red and blue are counterchanged, and yellow, green, white, blue, and red are ranked in descending order of transmittance.

Accordingly, if the aperture area of the red sub-pixel is increased, the transmittance of the color filters for displaying white is decreased because the color filter arranged in the red sub-pixel has a smaller transmittance than that of the color filters for displaying white. In addition, if the aperture areas of the green and yellow sub-pixels are decreased, the transmittance of the color filters for displaying white is further decreased because the color filters arranged in the green and yellow sub-pixels have a larger transmittance than that of the color filters for displaying white. In contrast, if the aperture area of the blue sub-pixel is decreased, the reduction in transmittance of the color filters for displaying white is minimized and possibly improved because the color filter arranged in the blue sub-pixel has the smallest transmittance. However, this relationship is satisfied if only color filter is taken into consideration. Hence, in an actual liquid crystal display device, the light-emitting efficiency of the light source of the backlight needs to be taken into consideration.

In preferred embodiment 1, a certain effect in which the lightness of red is increased is recognized if the aperture area of the red sub-pixel is the largest and the aperture areas of the green, blue, and yellow sub-pixels are equivalently small. However, in preferred embodiment 1, as shown in FIG. 10, the lightness of white is slightly reduced in all of the liquid crystal display devices A1 to A6 shown in Table 3. Accordingly, the display device in preferred embodiment 2 is superior to that in preferred embodiment 1, if the reduction in lightness of white can be minimized. In the present preferred embodiment, the lightness of white is also taken into consideration, and the aperture area of the red sub-pixel is increased, and the aperture area of anyone of the green, blue, and yellow sub-pixels is reduced. Such a preferred embodiment is mentioned below.

Table 4 shows an aperture area ratio among the respective sub-pixels, an aperture area ratio between the sub-pixel having the largest aperture area (red sub-pixel) and the sub-pixel having the smallest aperture area (green sub-pixel), a lightness of red, a lightness of white, an average transmittance of the color filters, and a light-emitting efficiency of the light source of the backlight, in liquid crystal display devices B1 to B6 prepared in the present preferred embodiment in the case that the red sub-pixel has a large aperture area and the blue sub-pixel has a small aperture area.

TABLE 4

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| B1 | 11:9:10:10 | 1.22 | 11.7 | 99.7 | 39.5 | 0.80 |
| B2 | 12:8:10:10 | 1.50 | 12.3 | 98.3 | 38.4 | 0.81 |
| B3 | 13:7:10:10 | 1.86 | 12.8 | 97.3 | 37.2 | 0.83 |
| B4 | 14:6:10:10 | 2.33 | 13.3 | 95.9 | 36.0 | 0.84 |
| B5 | 15:5:10:10 | 3.00 | 14.0 | 94.7 | 34.8 | 0.86 |

Table 5 shows an aperture area ratio among the respective sub-pixels, an aperture area ratio between the sub-pixel having the largest aperture area (red sub-pixel) and the sub-pixel having the smallest aperture area (blue sub-pixel), a lightness of red, a lightness of white, an average transmittance of the color filters, and a light-emitting efficiency of the light source of the backlight, in liquid crystal display devices C1 to C3 prepared in the present preferred embodiment in the case that the red sub-pixel has a large aperture area and the blue sub-pixel has a small aperture area.

TABLE 5

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| C1 | 11:10:9:10 | 1.22 | 11.6 | 95.7 | 40.2 | 0.75 |
| C2 | 12:10:8:10 | 1.50 | 12.1 | 90.8 | 39.8 | 0.72 |
| C3 | 13:10:7:10 | 1.86 | 12.9 | 84.3 | 39.3 | 0.68 |

Table 6 shows an aperture area ratio among the respective sub-pixels, an aperture area ratio between the sub-pixel having the largest aperture area (red sub-pixel) and the sub-pixel having the smallest aperture area (yellow sub-pixel), a lightness of red, a lightness of white, an average transmittance of the color filters, and a light-emitting efficiency of the light source of the backlight, in liquid crystal display devices D1 to D6 prepared in the present Preferred embodiment in the case that the red sub-pixel has a large aperture area and the yellow sub-pixel has a small aperture area.

TABLE 6

| | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| D1 | 11:10:10:9 | 1.22 | 12.4 | 98.4 | 39.0 | 0.80 |
| D2 | 12:10:10:8 | 1.50 | 13.8 | 96.9 | 37.5 | 0.82 |
| D3 | 13:10:10:7 | 1.86 | 15.2 | 94.8 | 36.0 | 0.83 |
| D4 | 14:10:10:6 | 2.33 | 16.4 | 92.7 | 34.4 | 0.85 |
| D5 | 15:10:10:5 | 3.00 | 17.8 | 91.3 | 32.8 | 0.88 |
| D6 | 16:10:10:4 | 4.00 | 19.5 | 88.9 | 31.2 | 0.90 |

Figure 14:
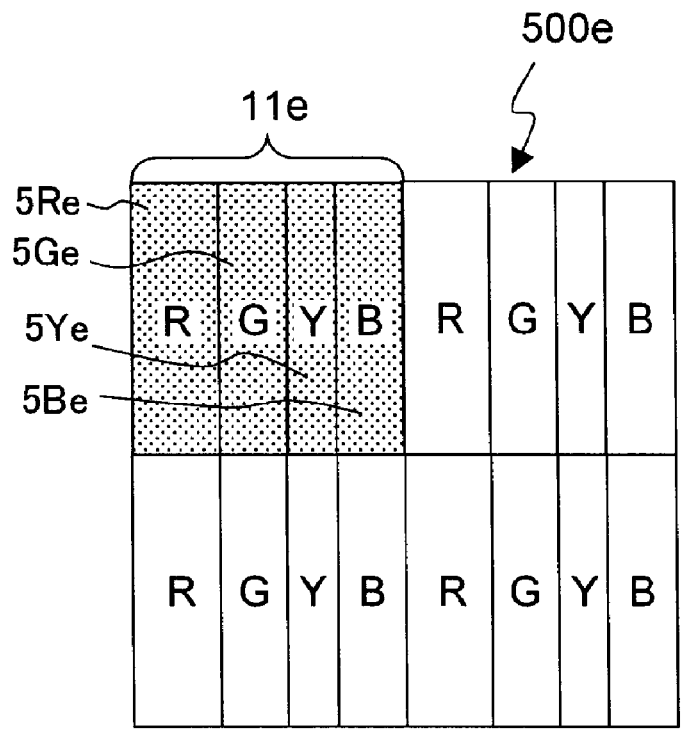
FIG. 14 is a view schematically showing a display surface of the liquid crystal display device in accordance with a preferred embodiment 2 of the present invention.
Figure 15:
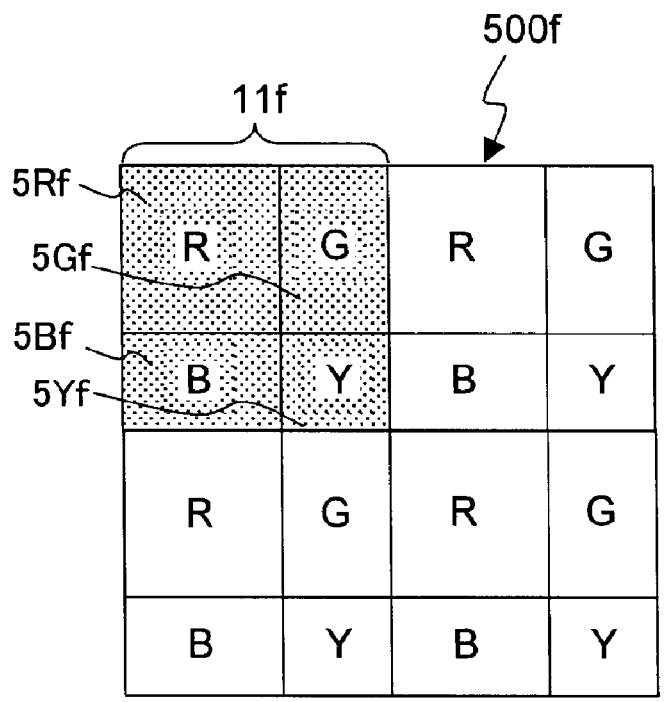
FIG. 15 is a view schematically showing a display surface of the liquid crystal display device in accordance with preferred embodiment 2 of the present invention.

Each of FIGS. 14 and 15 shows a schematic view of the liquid crystal display device in Table 6. FIG. 14 shows a configuration of a pixel 11e defining a display surface 500e of the liquid crystal display device, and the pixel 11e includes four sub-pixels 5Re, 5Ge, 5Be, and 5Ye arranged in a stripe pattern. FIG. 15 shows a configuration of a pixel 11f defining a display surface 500f of the liquid crystal display device, and the pixel 11f includes four sub-pixels 5Rf, 5Gf, 5Bf, and 5Yf arranged in two rows and two columns.

Figure 16:
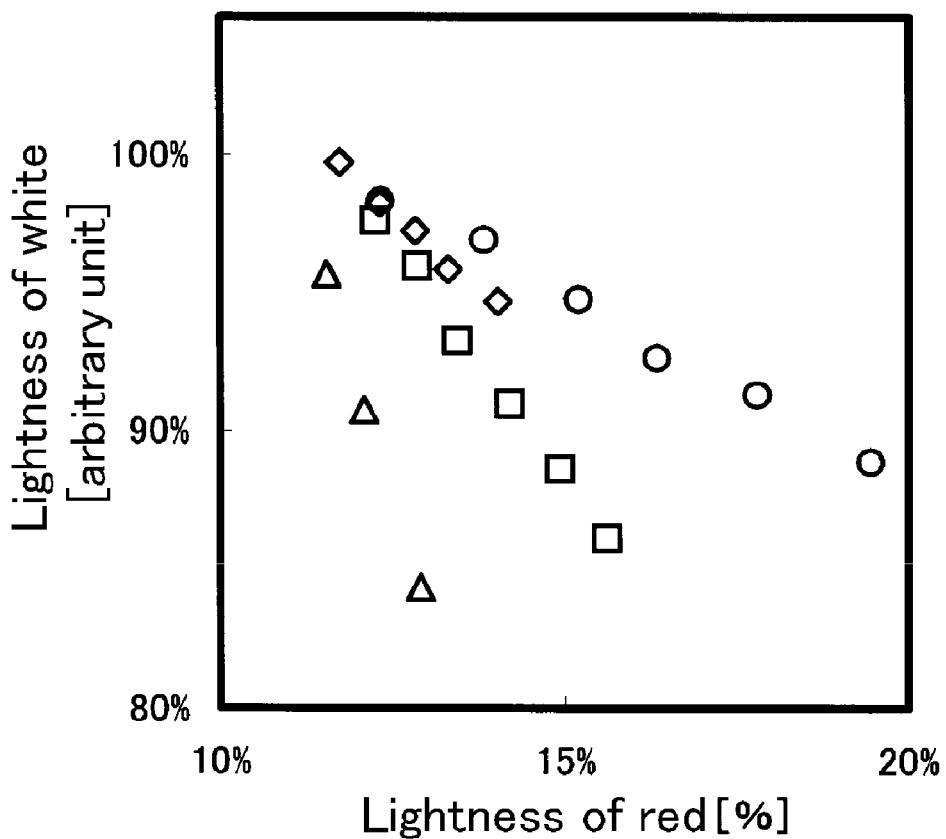
FIG. 16 is a diagram schematically showing a relationship between a lightness of red and a lightness of white displayed by the liquid crystal display device in accordance with preferred embodiment 2 of the present invention.

FIG. 16 shows a relationship between a lightness of red and a lightness of white displayed by the respective liquid crystal displays shown in Tables 4, 5, and 6. In FIG. 16, ◇ corresponds to the liquid crystal display devices B1 to B5 in Table 4; △ corresponds to the liquid crystal display devices C1 to C3 in Table 5; and ○ corresponds to the liquid crystal display devices D1 to D6 in Table 6. For comparison, □ shows the liquid crystal display devices A1 to A6 in accordance with preferred embodiment 1.

Figure 36:
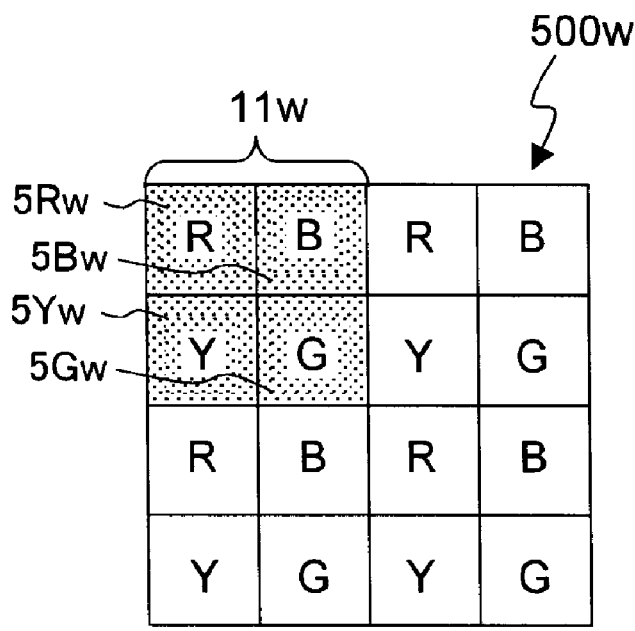
FIG. 36 is a view schematically showing a display surface of a conventional four-primary-color liquid crystal display device.
Figure 37:
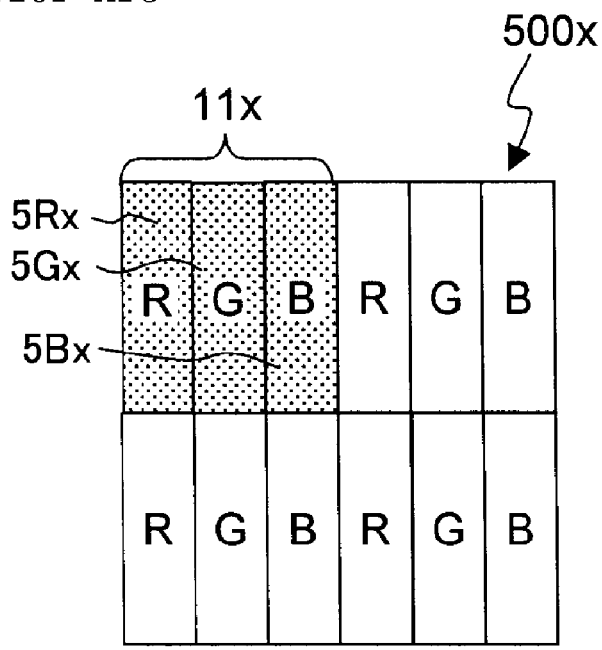
FIG. 37 is a view schematically showing a display surface of a conventional three-primary-color liquid crystal display device.

As shown in FIG. 16, according to the liquid crystal display devices in Tables 4 to 6, the effect of improving the lightness of red can be observed in comparison to the conventional four-primary-color liquid crystal display device (see Table 1) shown in FIG. 36. Particularly in the liquid crystal display device D6 in Table 6, red having a lightness of as high as 19.5% can be displayed. As shown in Tables 4 and 6, the average transmittance of the color filters is reduced in comparison to the liquid crystal display devices A1 to A6 in preferred embodiment 1 if the green or yellow sub-pixel has a small aperture area. However, the spectral characteristics of the light source of the backlight are adjusted in order to maximize the chromaticity of white. As a result, the light-emitting efficiency of the light source is increased. Therefore, as shown in FIG. 16, the reduction in lightness of white can be minimized with the increase in the light-emitting efficiency of the light source of the backlight, in comparison to the liquid crystal display devices A1 to A6 in preferred embodiment 1. Particularly in the liquid crystal display devices D1 to D6 in Table 6, if the sub-pixel having a small aperture area is a yellow sub-pixel having a color filter with the highest transmittance, the average transmittance of the color filters is reduced, but the light-emitting efficiency of the light source of the backlight is increased. As a result, the reduction in lightness of white is decreased with the increase in the light source of the backlight.

As shown in the liquid crystal display devices C1 to C3 in Table 5, it is not preferable to reduce the aperture area of the blue sub-pixel because the lightness of white is largely reduced. That is, if the sub-pixel having a small aperture area is a blue sub-pixel, the average transmittance of the color filters is increased because the color filter arranged in the blue sub-pixel has the smallest transmittance. However, the spectral characteristics of the light source of the backlight are adjusted in order to maximize the chromaticity of white. As a result, the light-emitting efficiency of the light source is reduced. Hence, the reduction in lightness of white is increased with the decrease in the light-emitting efficiency of the light source of the backlight.

As mentioned above, the preferred embodiment in which the yellow sub-pixel has a small aperture area is the most effective preferred embodiment, followed by the preferred embodiment in which the green sub-pixel has a small aperture area and the preferred embodiment in which the blue sub-pixel has a small aperture area.

The pixel design and the driving circuit design needs to be changed if the sub-pixels are largely different in aperture area. Therefore, it is preferable that an aperture area ratio among the sub-pixels is as small as possible. From viewpoint of this aperture area ratio, in the liquid crystal display device A4 in Table 3 in accordance with preferred embodiment 1, an aperture area ratio between the red sub-pixel having the largest aperture area, and the green, blue, and yellow sub-pixels having the smallest aperture areas is 1.61:1. In this case, the lightness of red is 14.2%; the lightness of white is 91.0%. The liquid crystal display device B5 in Table 4 in accordance with the present preferred embodiment can provide a lightness equivalent to 14.2% of red. According to this liquid crystal display device B5, the lightness of white is 94.7%. Therefore, the liquid crystal display device B5 is superior to the liquid crystal display device A4 in terms of the lightness of white. Further, the liquid crystal display device D3 in Table 6 in accordance with the present preferred embodiment also can provide a lightness equivalent to 14.2% of red. According to this liquid crystal display device D3, the lightness of white is 94.8%. Therefore, the liquid crystal display device D3 is also superior to the liquid crystal display device A4 in terms of the lightness of white.

However, the aperture area ratio is 3:1 in the liquid crystal display device B5 in Table 4, and it is 1.86:1 in the liquid crystal display device D3 in Table 6. The ratio in each device is larger than that of the liquid crystal display device A4 in Table 3 in accordance with preferred embodiment 1. As mentioned above, it is preferable that the liquid crystal display device A4 in Table 3 in accordance with preferred embodiment 1 is selected depending on the pixel design and the driving circuit device. That is, in some cases, preferred embodiment 1 is better than preferred embodiment 2.

Preferred Embodiment 3

As mentioned in preferred embodiment 2, the preferred embodiment in which the red sub-pixel has the largest aperture area and the green or yellow sub-pixel has the smallest aperture area is advantage in that the reduction in lightness of white can be minimized. In the present preferred embodiment, the following preferred embodiment is mentioned as a more preferable preferred embodiment: the aperture areas of the blue sub-pixel as well as the red sub-pixel are equivalently large and the aperture areas of the green and yellow sub-pixels are equivalently small.

In the present preferred embodiments, six liquid crystal display devices E1 to E6 shown in Table 7 were prepared. In each case, the aperture areas of the red and blue sub-pixels are equivalently large and the aperture areas of the green and yellow sub-pixels are equivalently small. Table 7 shows an aperture area ratio among the respective sub-pixels, an aperture area ratio between the sub-pixel having the largest aperture area (red or blue sub-pixel) and the sub-pixel having the smallest aperture area (green or yellow sub-pixel), a lightness of red, a lightness of white, an average transmittance of the color filters, and a light-emitting efficiency of the light source of the backlight, in the liquid crystal display devices E1 to E6 prepared in the present preferred embodiment.

TABLE 7

| | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| E1 | 11:9:11:9 | 1.22 | 12.1 | 102 | 38.1 | 0.85 |
| E2 | 12:8:12:8 | 1.50 | 13.9 | 101 | 35.5 | 0.90 |
| E3 | 13:7:13:7 | 1.86 | 15.3 | 100 | 32.7 | 0.97 |
| E4 | 14:6:14:6 | 2.33 | 17.0 | 97 | 29.6 | 1.04 |
| E5 | 15:5:15:5 | 3.00 | 18.7 | 92 | 26.2 | 1.11 |
| E6 | 16:4:16:4 | 4.00 | 20.5 | 85 | 22.6 | 1.19 |

Figure 17:
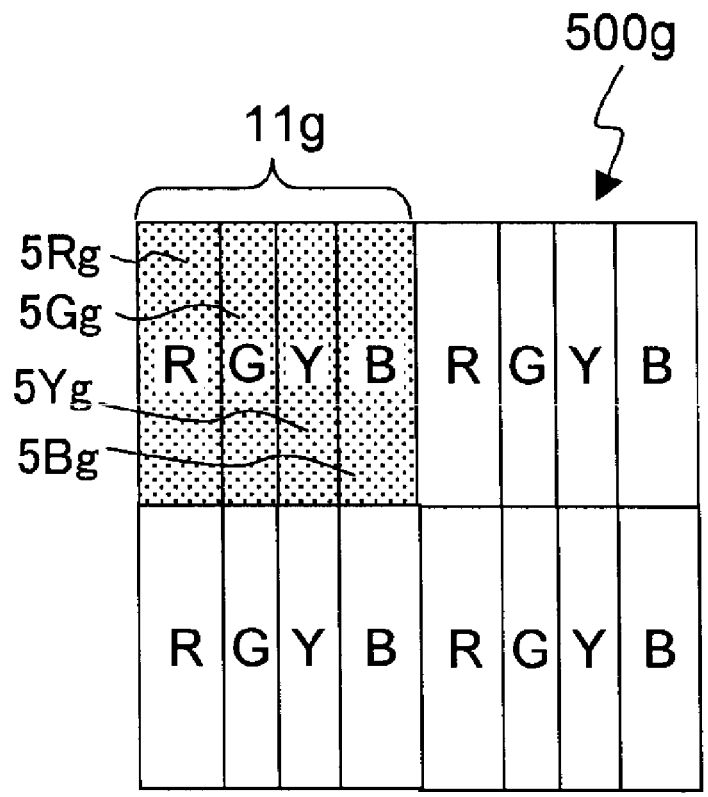
FIG. 17 is a view schematically showing a display surface of the liquid crystal display device in accordance with a preferred embodiment 3 of the present invention.
Figure 18:
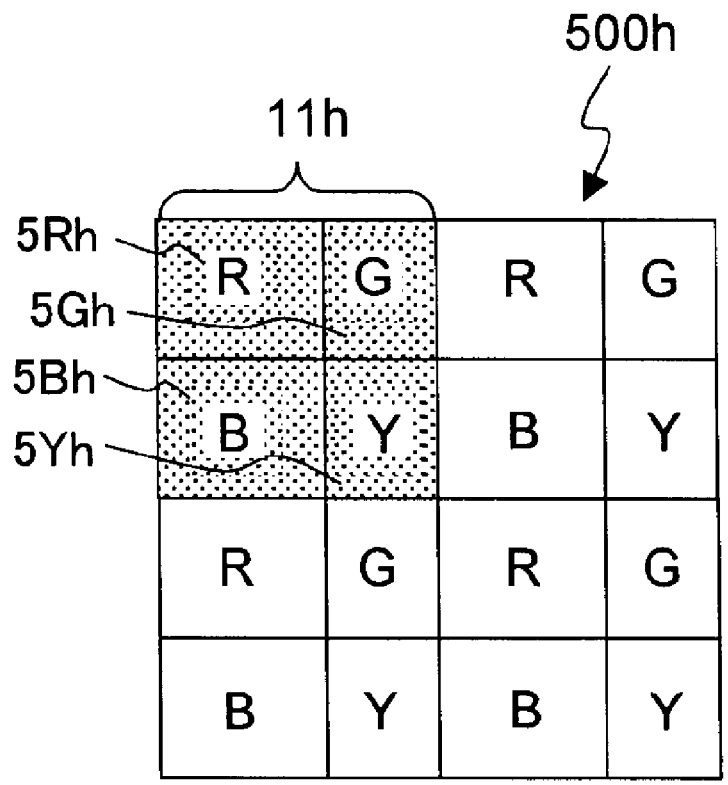
FIG. 18 is a view schematically showing a display surface of the liquid crystal display device in accordance with preferred embodiment 3 of the present invention.

Each of FIGS. 17 and 18 shows a schematic view of the liquid crystal display device in Table 7. FIG. 17 shows a configuration of a pixel 11g defining a display surface 500g of the liquid crystal display device, and the pixel 11g includes four sub-pixels 5Rg, 5Gg, 5Bg, and 5Yg arranged in a stripe pattern. FIG. 18 shows a configuration of a pixel 11h defining a display surface 500h of the liquid crystal display device, and the pixel 11h includes four sub-pixels 5Rh, 5Gh, 5Bh, and 5Yh arranged in two rows and two columns.

Figure 19:
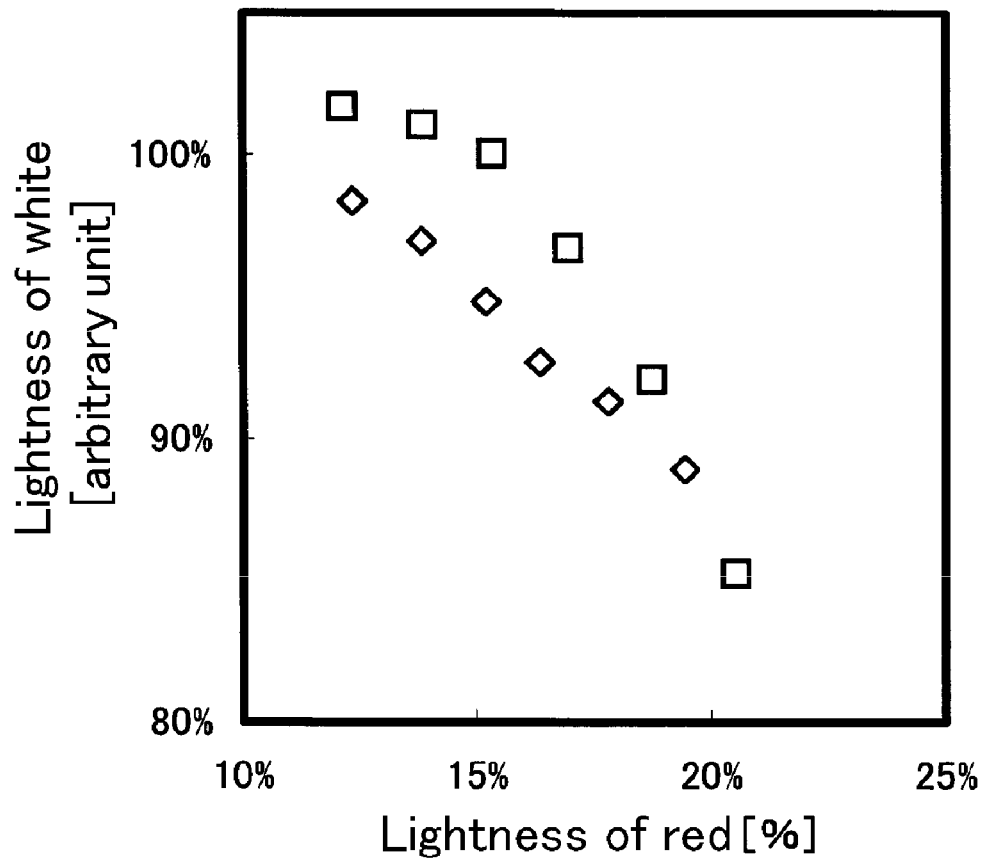
FIG. 19 is a diagram showing a relationship between a lightness of red and a lightness of white displayed by the liquid crystal display device in accordance with preferred embodiment 3 of the present invention.

FIG. 19 shows a relationship between a lightness of red and a lightness of white displayed by the respective liquid crystal displays E1 to E6 shown in Table 7. In FIG. 19, □ corresponds to the liquid crystal display devices E1 to E5 in Table 7. For comparison, ◊ shows the liquid crystal display devices D1 to D6 in which the reduction in lightness of white is small in accordance with preferred embodiment 2.

According to the present preferred embodiment, the liquid crystal display devices D1 to D6 in preferred embodiment 2 are further advantageous in terms of lightness of white, and especially in the liquid crystal display devices E1 to E3 in Table 7, the lightness of white is higher than that in the conventional four-primary-color liquid crystal display device (FIG. 36) in which four sub-pixels have the same aperture area. In order to maximize the chromaticity of white, a yellow component of light from the backlight needs to be increased as the blue sub-pixel has a larger aperture area. Therefore, the light-emitting efficiency can be improved. If the lightness of red is 19% or more, specifically if the liquid crystal display device E6 in Table 7 in the present preferred embodiment is compared with the liquid crystal display device D6 in Table 6 in preferred embodiment 2, the present preferred embodiment is disadvantageous in terms of display of white, in some cases.

Figure 20:
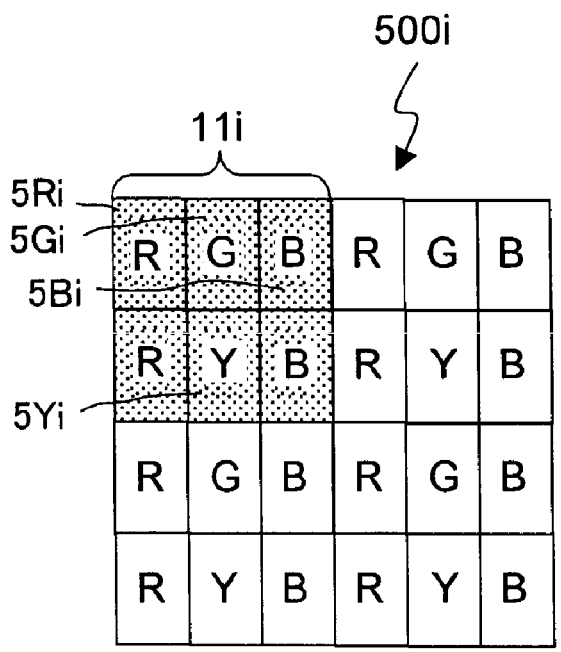
FIG. 20 is a view schematically showing a modified example of the display surface of the liquid crystal display device in accordance with preferred embodiment 3 of the present invention.

The pixel configuration of the liquid crystal display device in the present preferred embodiment is not limited to the configurations shown in FIGS. 17 and 18. For example, as shown in FIG. 20, a pixel 11i defining a display surface 500i is divided into six sub-pixels and two red sub-pixels 5R and two blue pixels 5B may be arranged. In FIG. 20, with regard to an aperture area ratio among respective sub-pixels 5Ri, 5Gi, 5Bi, and 5Yi, red:green:blue:yellow is 2:1:2:1. Thus, a plurality of red sub-pixels and a plurality of blue sub-pixels are arranged, and thereby modification of the pixel design and the driving circuit design can be minimized.

Figure 21:
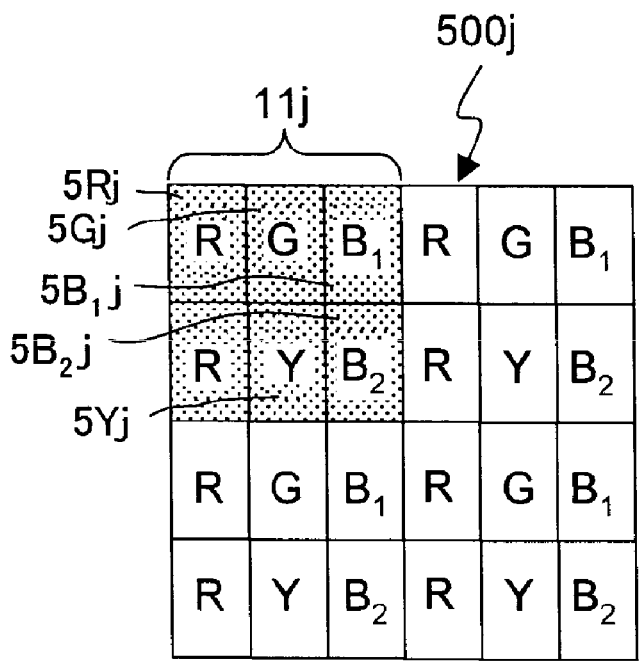
FIG. 21 is a view schematically showing a modified example of the display surface of the liquid crystal display device in accordance with preferred embodiment 3 of the present invention.
Figure 22:
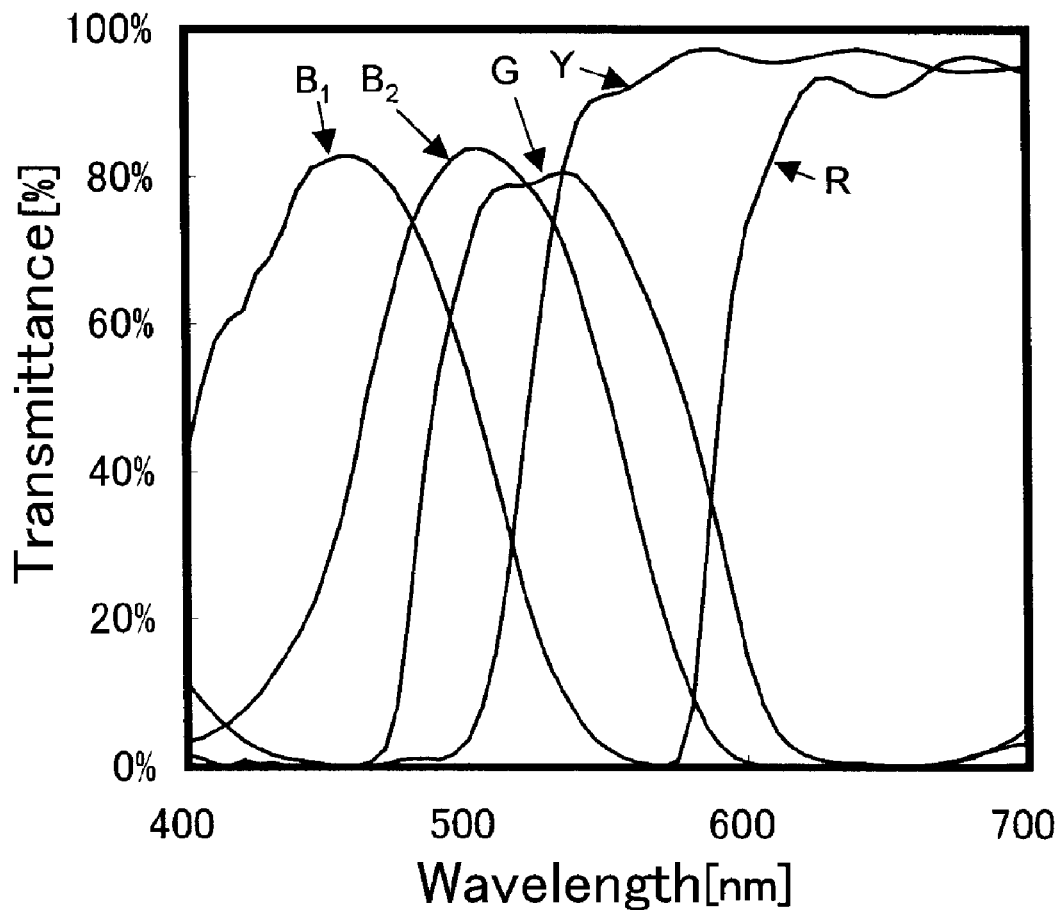
FIG. 22 is a diagram schematically showing spectral transmittance characteristics of the color filters used in the liquid crystal display device in FIG. 21.

As shown in FIG. 21, a pixel 11j defining a display surface 500j is divided into six sub-pixels, and two red sub-pixels and two blue sub-pixel having different color characteristics are arranged. FIG. 22 shows spectral characteristics of a color filter in this case. In this case, light having a dominant wavelength of about 460 nm passes through a blue sub-pixel $5B_1j$, and light having a dominant wavelength of about 488 nm passes through and a blue sub-pixel $5B_2j$. Also in the case shown in FIG. 21, a red sub-pixel 5Rj, a green sub-pixel 5Gj, the blue sub-pixels $5B_1j$ and $5B_2j$, and a yellow sub-pixel 5Yj have equivalent aperture areas. With regard to an aperture area ratio among the respective sub-pixels, red:green:blue:yellow is 2:1:1:2. Thus, two blue sub-pixels having different color characteristics are arranged, and thereby the color reproduction range can be further extended.

Figure 23:
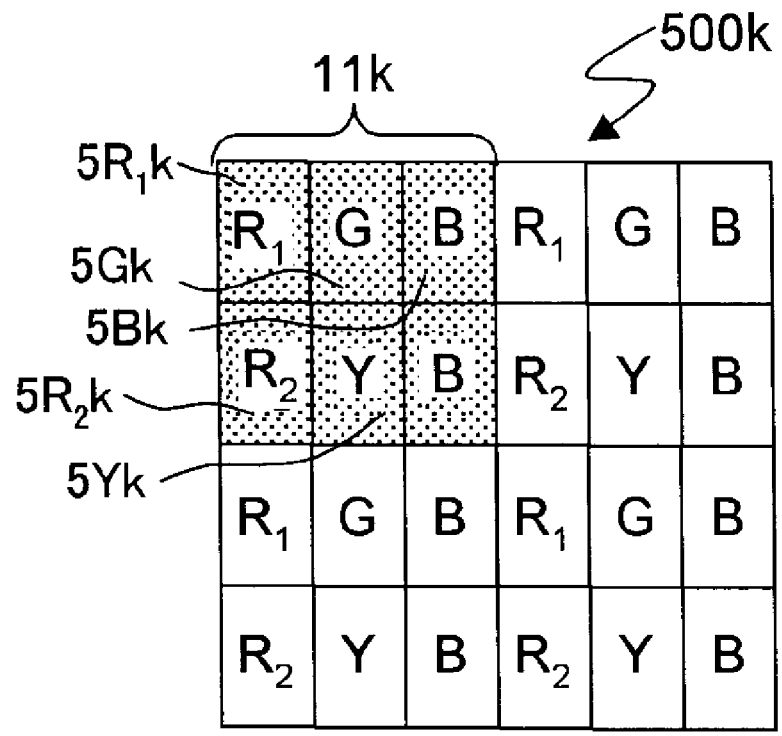
FIG. 23 is a view schematically showing a modified example of the display surface of the liquid crystal display device in accordance with preferred embodiment 3 of the present invention.

As shown in FIG. 23, a pixel 11k defining a display surface 500k is divided into six sub-pixels, and two red sub-pixels having different color characteristics and two blue sub-pixels are arranged. FIG. 13 shows spectral characteristics of a color filter in this case. In this case, light having a dominant wavelength of about 612 nm passes through a red sub-pixel $5R_1k$, and light having a dominant wavelength of about 607 nm passes through a red sub-pixel $5R_2k$. Also in the case shown in FIG. 23, the aperture areas of the red sub-pixels $5R_1k$ and $5R_2k$, a green sub-pixel 5Gk, a blue sub-pixel 5Bk, and a yellow sub-pixel 5Yk are equivalent. With regard to an aperture area ratio among the respective sub-pixels, red:green:blue:yellow is 2:1:1:2. Thus, even by arranging the red sub-pixels having different color characteristics, the color reproduction range can be further extended.

Figure 24:
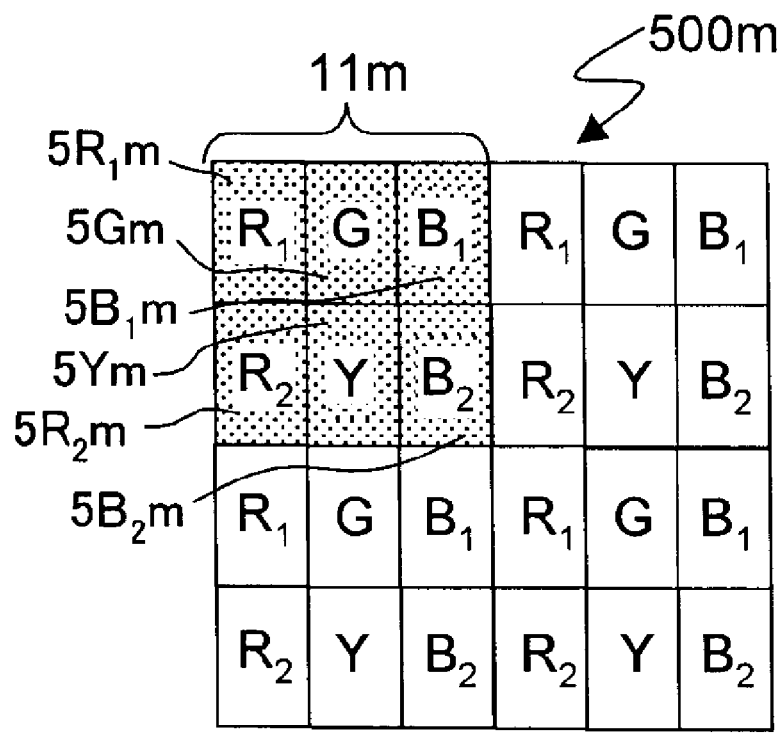
FIG. 24 is a view schematically showing a modified example of the display surface of the liquid crystal display device in accordance with preferred embodiment 3 of the present invention.

Further, as shown in FIG. 24, a pixel 11m defining a display surface about 500 m is divided into six sub-pixels, and two red sub-pixels having different color characteristics and two blue sub-pixels having different color characteristics are arranged. Each of FIGS. 13 and 22 shows spectral characteristics of a color filter in this case. Also in the case shown in FIG. 24, the aperture areas of red sub-pixels 5R₁m and 5R₂m, a green sub-pixel 5Gm, blue sub-pixels 5B₁m and 5B₂m, and a yellow sub-pixel 5Ym are equivalent. With regard to an aperture area ratio among the respective sub-pixels, red: green: blue: yellow is 2:1:1:2. Thus, even by arranging the red sub-pixels having different color characteristics and the blue sub-pixels having different color characteristics, the color reproduction range can be further extended. These pixel configurations are just mentioned as one example, and the present preferred embodiment is not limited to these pixel configurations.

Preferred Embodiment 4

According to preferred embodiment 3, the preferred embodiment in which the aperture areas of the red and blue sub-pixels are equivalently large and the aperture areas of the green and yellow sub-pixels are equivalently small is mentioned. According to the present preferred embodiment, an preferred embodiment in which green and yellow sub-pixels which have small aperture areas are arranged to be different in aperture area ratio.

Table 8 shows an aperture area ratio among the respective sub-pixels, an aperture area ratio between the sub-pixel having the largest aperture area (red or blue sub-pixel) and the sub-pixel having the smallest aperture area (green sub-pixel), a lightness of red, a lightness of white, an average transmittance of the color filters, and a light-emitting efficiency of the light source of the backlight, in liquid crystal display devices F1 to F4 prepared in the present preferred embodiment, in the case that aperture areas of the red and blue sub-pixel are equivalently large and an aperture area of the green sub-pixel is small.

the pixel 11p includes four sub-pixels 5Rp, 5Gp, 5Bp, and 5Yp arranged in two rows and two columns. These pixel configurations are just mentioned as one example. The present preferred embodiment is not especially limited to these pixel configurations.

Table 9 shows an aperture area ratio among the respective sub-pixels, an aperture area ratio between the sub-pixel having the largest aperture area (red or blue sub-pixel) and the sub-pixel having the smallest aperture area (yellow sub-pixel), a lightness of red, a lightness of white, an average transmittance of the color filters, and a light-emitting efficiency of the light source of the backlight, in liquid crystal display devices G1 to G3 prepared in the present preferred embodiment, in the case that aperture areas of the red and blue sub-pixel are equivalently large and an aperture area of the yellow sub-pixel is small.

TABLE 9

| | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| G1 | 11:10:11:8 | 1.38 | 13.0 | 100 | 37.5 | 0.84 |
| G2 | 12:10:12:6 | 2.00 | 15.2 | 99 | 34.4 | 0.91 |
| G3 | 13:10:13:4 | 3.25 | 18.0 | 96 | 31.1 | 0.98 |

Figure 27:
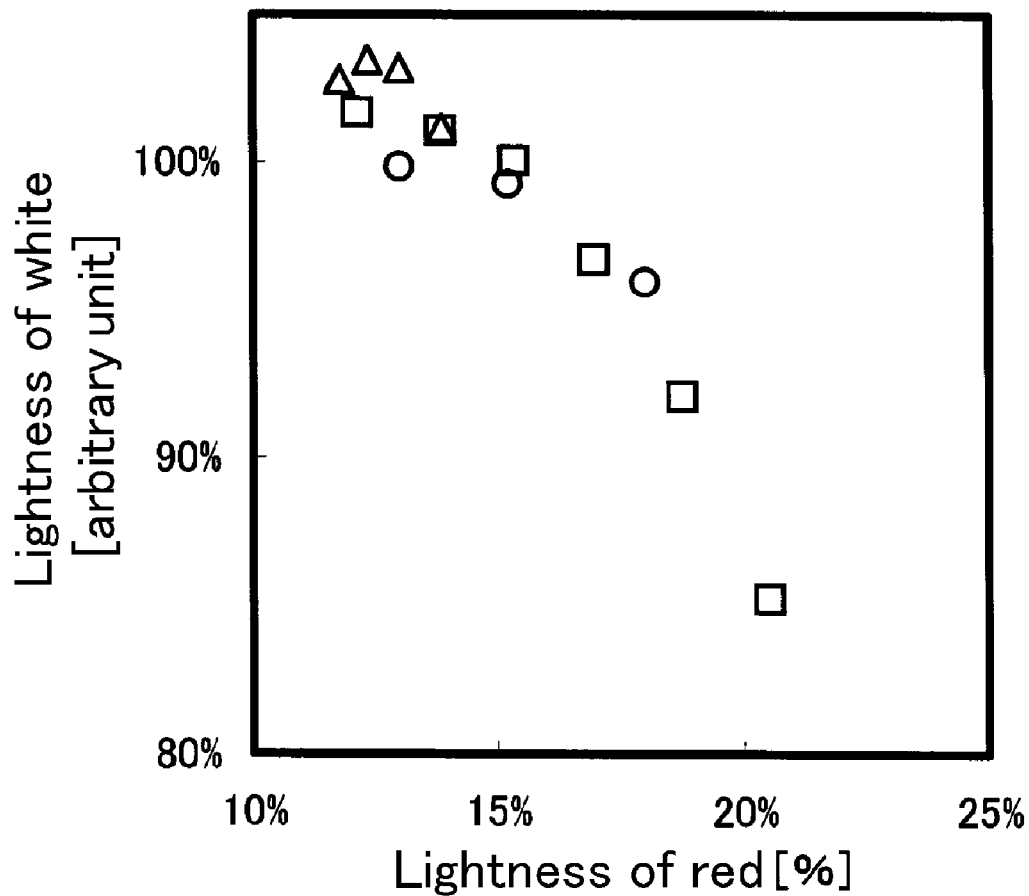
FIG. 27 is a diagram showing a relationship between a lightness of red and a lightness of white displayed by the liquid crystal display device in accordance with preferred embodiment 4 of the present invention.

FIG. 27 shows a relationship between a lightness of red and a lightness of white displayed by the liquid crystal displays shown in Tables 8 and 9. In FIG. 27, Δ corresponds to the liquid crystal display device in Table 8; and ○ corresponds to the liquid crystal display device in Table 9. For comparison, □ shows the liquid crystal display devices E1 to E6 in Table 7 in accordance with the preferred embodiment 3 in which the aperture areas of the red and blue sub-pixels are equivalently large and the aperture areas of the green and yellow sub-pixels are equivalently small.

FIG. 27 shows that the liquid crystal display devices F1 to F4 in Table 8 in the present preferred embodiment are superior in lightness of white to the liquid crystal display devices E1 to E4 in Table 7 in preferred embodiment 3, although the lightness of red is small in the liquid crystal display devices F1 to F4. However, if two liquid crystal display devices that

TABLE 8

| | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| F1 | 11:8:11:10 | 1.38 | 11.8 | 103 | 38.6 | 0.84 |
| F2 | 12:6:12:10 | 2.00 | 12.3 | 103 | 36.4 | 0.90 |
| F3 | 13:4:13:10 | 3.25 | 13.0 | 103 | 33.9 | 0.96 |
| F4 | 14:2:14:10 | 7.00 | 13.9 | 101 | 31.2 | 1.03 |

Figure 25:
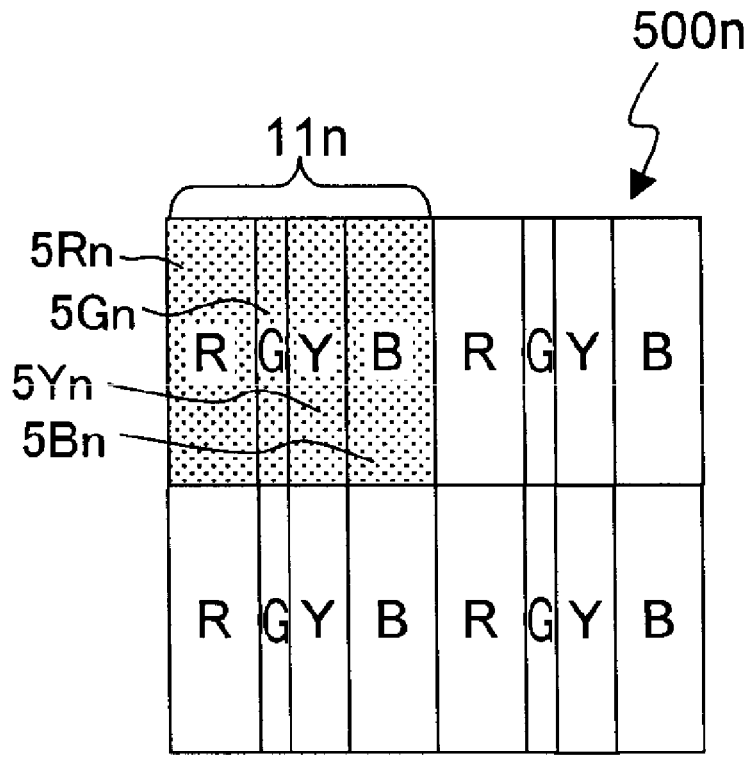
FIG. 25 is a view schematically showing a display surface of the liquid crystal display device in accordance with a preferred embodiment 4 of the present invention.
Figure 26:
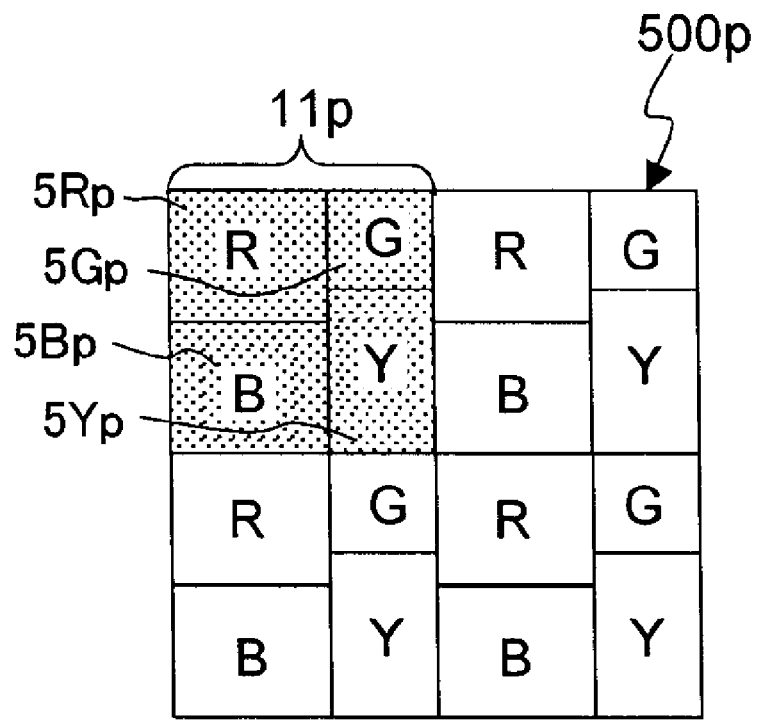
FIG. 26 is a view schematically showing a display surface of the liquid crystal display device in accordance with preferred embodiment 4 of the present invention.

Each of FIGS. 25 and 26 schematically shows a liquid crystal display device in Table 8. FIG. 25 shows a configuration of a pixel 11n defining a display surface 500n of the liquid crystal display device, and the pixel 11n includes four sub-pixels 5Rn, 5Gn, 5Bn, and 5Yn arranged in a stripe pattern. FIG. 26 shows a configuration of a pixel 11p defining a display surface 500p of the liquid crystal display device, and are the same in the aperture area ratio among the sub-pixels, i.e., the liquid crystal display device F3 in Table 8 and the liquid crystal display device G3 in Table 9, are compared, the lightness of white is high, but a large effect of improving the lightness of red cannot be obtained and the lightness of red cannot be increased to about 14% or more according to the liquid crystal display device F3 in Table 8. In contrast, according to the liquid crystal display device G3 in Table 9, the lightness of white is not so high, but a large effect of improving the lightness of red can be obtained. Also in this case, the preferred embodiment may be appropriately selected depending on a desired lightness of red. The liquid crystal display devices G1 to G3 in Table 9 in the present preferred embodiment are superior in lightness of red to the liquid crystal display devices E1 to E3 in Table 7 in preferred embodiment 3, although the lightness of white is small in the liquid crystal display devices G1 to G3.

Preferred Embodiment 5

As shown in preferred embodiments 1 and 4, if the aperture areas of both of the red and blue sub-pixels are large, the average transmittance of the color filters is reduced in comparison to the case that only the aperture area of the red sub-pixel is large. However, the proportion of the blue component which passes through the color filter is increased. Therefore, with regard to the wavelength characteristics of the backlight used, the blue component whose light-emitting efficiency is low can be decreased. Therefore, a light source having a high light-emitting efficiency can be used as the backlight. As a result, if the average transmittance of the color filters and the light-emitting efficiency of the light source of the backlight are taken into consideration, the light-emitting efficiency of the light source of the backlight can be high enough to compensate the reduction of the average transmittance of the color filter due to the increase in aperture area of the blue sub-pixel. According to preferred embodiments 1 to 4, the case where at least red sub-pixel has the largest aperture area is mentioned. In the present preferred embodiment, the case where the blue sub-pixel has the largest aperture area is mentioned.

Table 10 shows an aperture area ratio among the respective sub-pixels, an aperture area ratio between the sub-pixel having the largest aperture area (blue sub-pixel) and the sub-pixel having the smallest aperture area (green or yellow sub-pixel), a lightness of red, a lightness of white, an average transmittance of the color filters, and a light-emitting efficiency of the light source of the backlight, in liquid crystal display devices H1 to H4 prepared in the present Preferred embodiment, in the case that an aperture area of the blue sub-pixel is large and aperture areas of the green and yellow sub-pixels are equivalently small.

TABLE 10

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| H1 | 10:9:12:9 | 1.33 | 11.7 | 105 | 38.1 | 0.87 |
| H2 | 10:8:14:8 | 1.75 | 12.6 | 106 | 35.4 | 0.95 |
| H3 | 10:7:16:7 | 2.29 | 13.5 | 104 | 32.4 | 1.02 |
| H4 | 10:6:18:6 | 3.00 | 14.8 | 101 | 29.2 | 1.09 |

Figure 28:
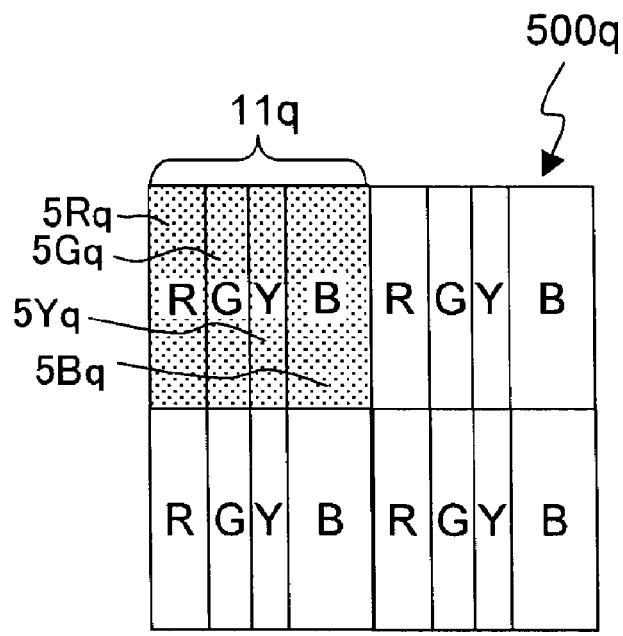
FIG. 28 is a view schematically showing a display surface of the liquid crystal display device in accordance with a preferred embodiment 5 of the present invention.
Figure 29:
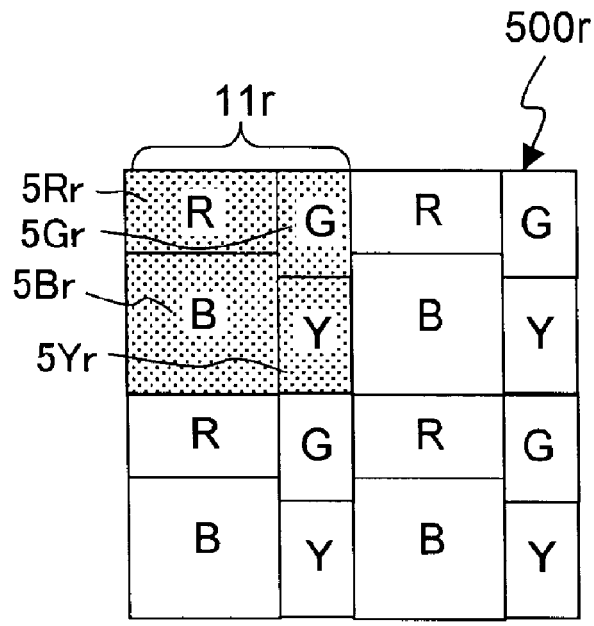
FIG. 29 is a view schematically showing a display surface of the liquid crystal display device in accordance with preferred embodiment 5 of the present invention.

Each of FIGS. 28 and 29 schematically shows a liquid crystal display device in Table 10. FIG. 28 shows a configuration of a pixel 11q defining a display surface 500q of the liquid crystal display device, and the pixel 11q includes four sub-pixels 5Rq, 5Gq, 5Bq, and 5Yq arranged in a stripe pattern. FIG. 29 shows a configuration of a pixel 11r defining a display surface 500r of the liquid crystal display device, and the pixel 11r includes four sub-pixels 5Rr, 5Gn, 5Br, and 5Yr arranged in two rows and two columns. These pixel configurations are just mentioned as one example. The present preferred embodiment is not limited to these pixel configurations.

Table 11 shows an aperture area ratio among the respective sub-pixels, an aperture area ratio between the sub-pixel having the largest aperture area (blue sub-pixel) and the sub-pixel having the smallest aperture area (green sub-pixel), a lightness of red, a lightness of white, an average transmittance of the color filters, and a light-emitting efficiency of the light source of the backlight, in liquid crystal display devices I1 to I4 prepared in the present Preferred embodiment, in the case that an aperture area of the blue sub-pixel is large and an aperture area of the green sub-pixel is small.

TABLE 11

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| I1 | 10:9:11:10 | 1.33 | 11.1 | 103 | 39.0 | 0.83 |
| I2 | 10:8:12:10 | 1.75 | 11.2 | 105 | 37.5 | 0.86 |
| I3 | 10:7:13:10 | 2.29 | 11.3 | 107 | 35.9 | 0.90 |
| I4 | 10:6:14:10 | 3.00 | 11.3 | 108 | 34.2 | 0.94 |

Table 12 shows an aperture area ratio among the respective sub-pixels, an aperture area ratio between the sub-pixel having the largest aperture area (blue sub-pixel) and the sub-pixel having the smallest aperture area (yellow sub-pixel), a lightness of red, a lightness of white, an average transmittance of the color filters, and a light-emitting efficiency of the light source of the backlight, in liquid crystal display devices J1 to J4 prepared in the present preferred embodiment, in the case that an aperture area of the blue sub-pixel is large and an aperture area of the yellow sub-pixel is small.

TABLE 12

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| J1 | 10:10:11:9 | 1.33 | 11.7 | 102 | 39.0 | 0.83 |
| J2 | 10:10:12:8 | 1.75 | 12.5 | 103 | 37.5 | 0.87 |
| J3 | 10:10:13:7 | 2.29 | 13.2 | 103 | 35.9 | 0.91 |
| J4 | 10:10:14:6 | 3.00 | 14.2 | 102 | 34.2 | 0.95 |

Figure 30:
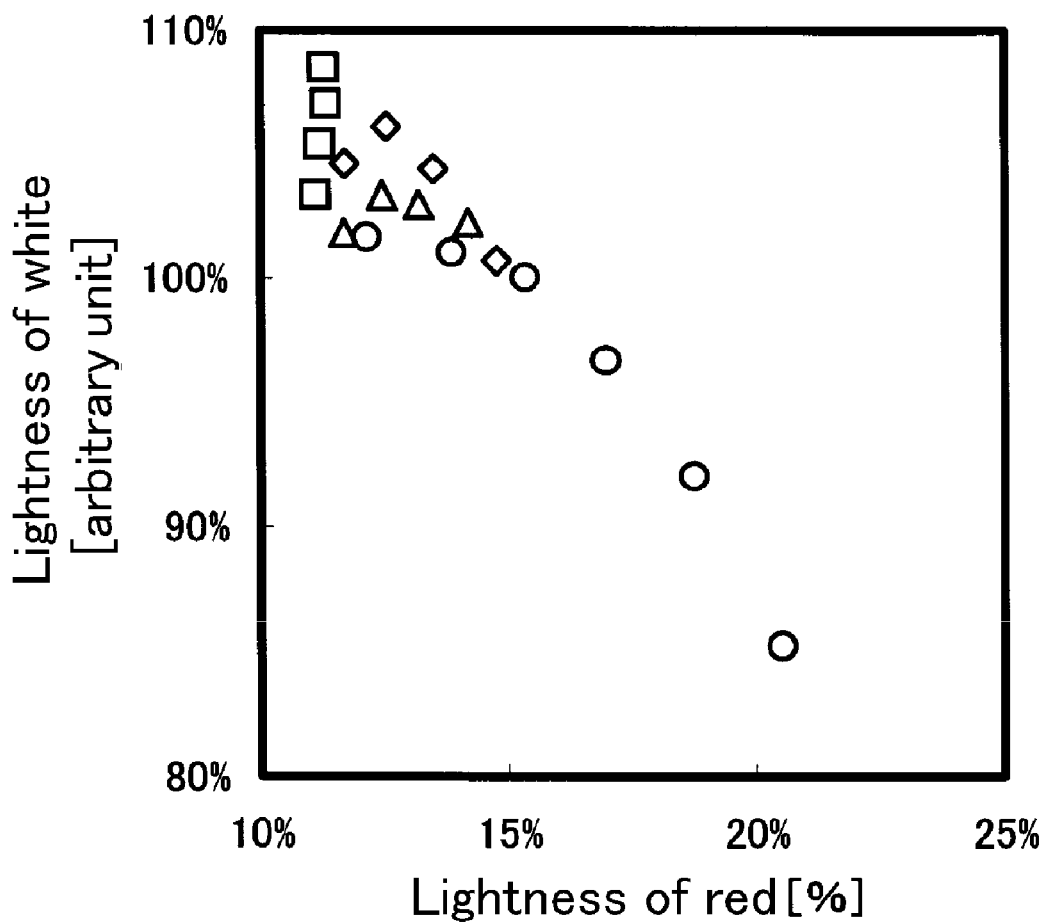
FIG. 30 is a diagram showing a relationship between a lightness of red and a lightness of white displayed by the liquid crystal display device in accordance with preferred embodiment 5 of the present invention.

FIG. 30 shows a relationship between a lightness of red and a lightness of white displayed by the liquid crystal displays shown in Tables 10 to 12. In FIG. 30, ◊ corresponds to the liquid crystal display device in Table 10; □ corresponds to the liquid crystal display device in Table 11; and Δ corresponds to the liquid crystal display device in Table 12. For comparison, ○ shows the liquid crystal display devices E1 to E6 in Table 7 in accordance with the preferred embodiment 3 in which the aperture areas of the red and blue sub-pixels are equivalently large and the aperture areas of the green and yellow sub-pixels are equivalently small.

According to the liquid crystal display devices I1 to I4 in Table 11, the effect of improving the lightness of white can be observed, but the effect of improving the lightness of red is hardly observed. In contrast, the lightness of white is about 106% when the lightness of red is about 12.6% in the liquid crystal display device H2 in Table 10; the lightness of white is about 103% when the lightness of red is about 12.5% in the liquid crystal display device J2 in Table 12. Thus, the liquid crystal display devices H2 and J2 are excellent in lightness of white. However, according to the present preferred embodiment, the lightness of red is not so increased. Therefore, if the lightness of red needs to be increased to about 15% or more, it is preferable that an appropriate liquid crystal display device is selected from those in preferred embodiments 1 to 4.

Figure 31:
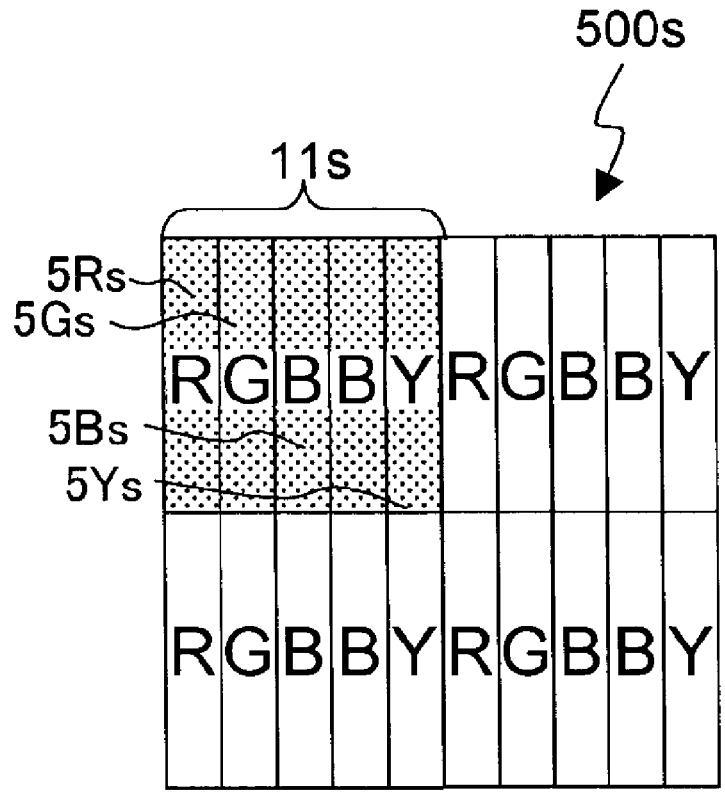
FIG. 31 is a view schematically showing a modified example of the display surface of the liquid crystal display device in accordance with preferred embodiment 5 of the present invention.

The pixel configuration of the liquid crystal display device in the present preferred embodiment is not limited to those shown in FIGS. 28 and 29. For example, as shown in FIG. 31, a pixel 11s defining a display surface 500s is divided into five sub-pixels and two blue sub-pixels 5B may be arranged. In FIG. 31, with regard to an aperture area ratio among the respective sub-pixels 5Rs, 5Gs, 5Bs, and 5Ys, red:green:blue:yellow is 1:1:2:1. Thus, a plurality of blue sub-pixels are arranged, and thereby modification of the pixel design and the driving circuit design can be minimized.

Figure 32:
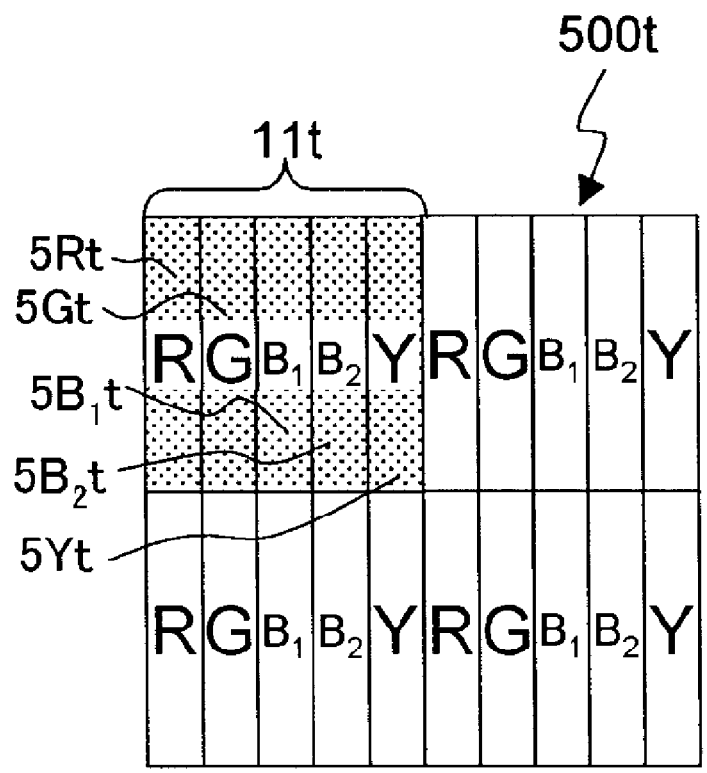
FIG. 32 is a view schematically showing a modified example of the display surface of the liquid crystal display device in accordance with preferred embodiment 5 of the present invention.

As shown in FIG. 32, a pixel 11t defining a display surface 500t is divided into five pixels, and two blue sub-pixels having different color characteristics may be arranged. FIG. 22 shows spectral characteristics of a color filter in this case. In this case, light having a dominant wavelength of about 460 nm passes through a blue sub-pixel $5B_1t$, and light having a dominant wavelength of about 488 nm passes through a blue sub-pixel $5B_2t$. Also in the case shown in FIG. 32, aperture areas of a red sub-pixel 5Rt, a green sub-pixel 5Gt, the blue sub-pixels $5B_1t$ and $5B_2t$, and a yellow sub-pixel 5Yt are equivalent. With regard to an aperture area ratio among the respective sub-pixels, red:green:blue:yellow is 2:1:1:2. Thus, two blue sub-pixels having different color characteristics are arranged, and thereby the color reproduction range can be further extended. These pixel configurations are just mentioned as one example. The present preferred embodiment is not limited to these pixel configurations.

Preferred Embodiment 6

The present preferred embodiment shows a case where the yellow sub-pixel has the smallest aperture area.

Table 13 shows an aperture area ratio among the respective sub-pixels, an aperture area ratio between the sub-pixel having the largest aperture area (red, green, or blue sub-pixel) and the sub-pixel having the smallest aperture area (yellow sub-pixel), a lightness of red, a lightness of white, an average transmittance of the color filters, and a light-emitting efficiency of the light source of the backlight, in liquid crystal display devices K1 to K5 prepared in the present preferred embodiment, in the case that an aperture area of the yellow sub-pixel is small and aperture areas of the other sub-pixels are equivalently large.

TABLE 13

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| K1 | 10.5:10.5:10.5:8.5 | 1.24 | 12.2 | 100.0 | 38.7 | 1.00 |
| K2 | 11:11:11:7 | 1.57 | 13.6 | 99.0 | 37.0 | 0.99 |
| K3 | 11.5:11.5:11.5:5.5 | 2.09 | 15.2 | 98.2 | 35.2 | 0.98 |
| K4 | 12:12:12:4 | 3.00 | 17.3 | 95.6 | 33.3 | 0.96 |
| K5 | 12.5:12.5:12.5:2.5 | 5.00 | 19.3 | 93.5 | 31.3 | 0.94 |

Figure 33:
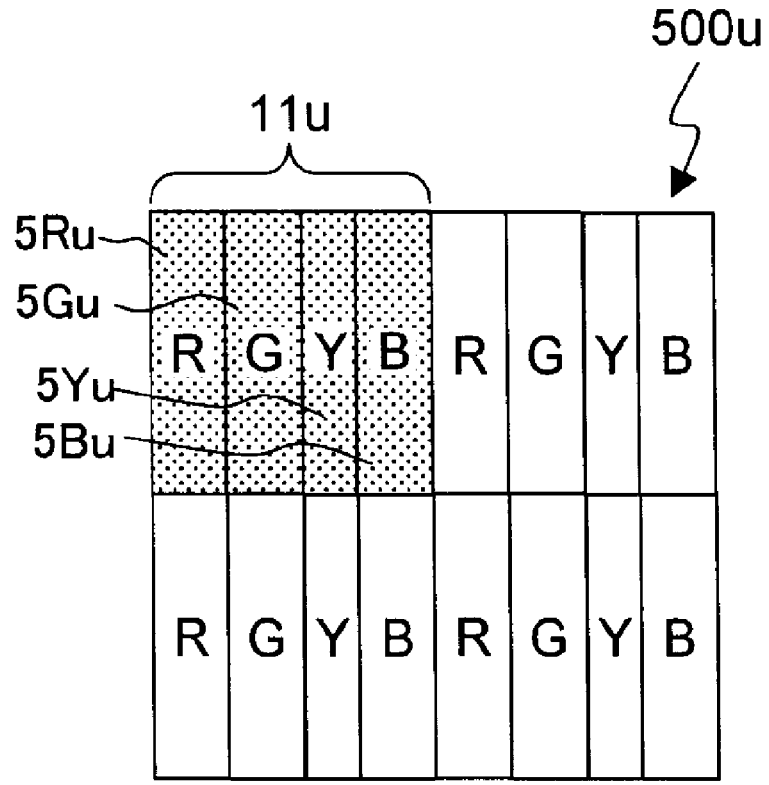
FIG. 33 is a view schematically showing a display surface of the liquid crystal display device in accordance with a preferred embodiment 6 of the present invention.
Figure 34:
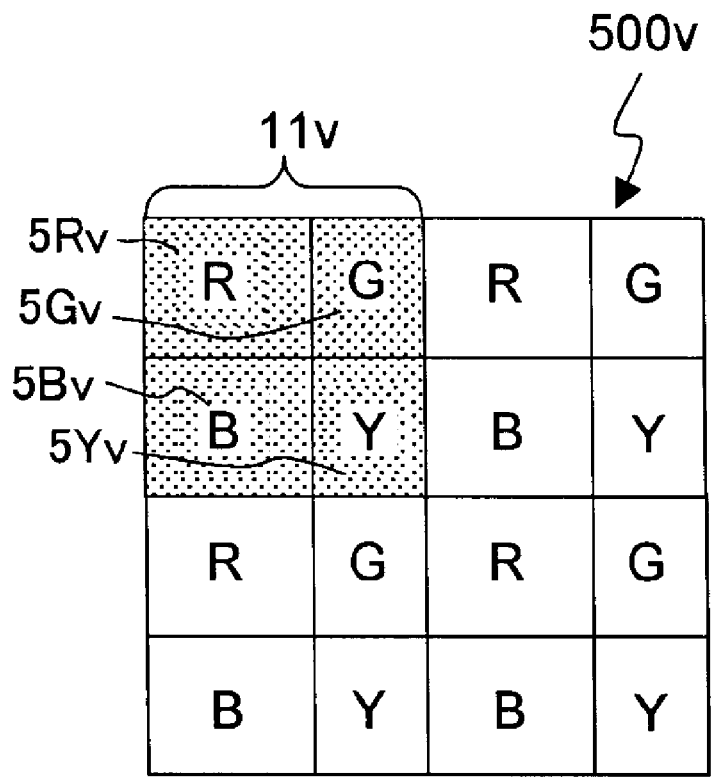
FIG. 34 is a view schematically showing a display surface of the liquid crystal display device in accordance with preferred embodiment 6 of the present invention.

Each of FIGS. 33 and 34 schematically shows a liquid crystal display device in Table 13. FIG. 33 shows a configuration of a pixel 11u defining a display surface 500u of the liquid crystal display, and the pixel 11u includes four sub-pixels 5Ru, 5Gu, 5Bu, and 5Yu arranged in a stripe pattern. FIG. 34 shows a configuration of a pixel 11v defining a display surface 500v of the liquid crystal display, and the pixel 11v includes four sub-pixels 5Rv, 5Gv, 5Bv, and 5Yv arranged in two rows and two columns. These pixel configurations are just mentioned as one example. The present preferred embodiment is not limited to these pixel configurations.

Table 14 shows an aperture area ratio among the respective sub-pixels, an aperture area ratio between the sub-pixel having the largest aperture area (red or green sub-pixel) and the sub-pixel having the smallest aperture area (yellow sub-pixel), a lightness of red, a lightness of white, an average transmittance of the color filters, and a light-emitting efficiency of the light source of the backlight, in liquid crystal display devices L1 to L4 prepared in the present preferred embodiment, in the case that an aperture area of the yellow sub-pixel is small and aperture areas of the red and green sub-pixels are equivalently large.

According to the liquid crystal display devices in Tables 13 and 14, the aperture area ratio needs to be increased, but the light-emitting efficiency of the light source of the backlight is increased. Therefore, such liquid crystal display devices are advantageously employed in order to increase the lightness of red.

Preferred Embodiment 7

The present preferred embodiment shows a case where red, blue, green, and yellow sub-pixels are ranked in descending order of aperture area.

Table 15 shows an aperture area ratio among the respective sub-pixels, an aperture area ratio between the sub-pixel having the largest aperture area (red sub-pixel) and the sub-pixel having the smallest aperture area (yellow sub-pixel), a lightness of red, a lightness of white, an average transmittance of

TABLE 14

| | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| L1 | 11:11:10:8 | 1.24 | 13.0 | 100.6 | 37.6 | 0.85 |
| L2 | 12:12:10:6 | 1.57 | 15.2 | 98.6 | 34.4 | 0.91 |
| L3 | 13:13:10:4 | 3.25 | 18.0 | 95.9 | 31.1 | 0.98 |
| L4 | 14:14:14:2 | 7.00 | 21.3 | 90.8 | 27.5 | 1.04 |

Figure 35:
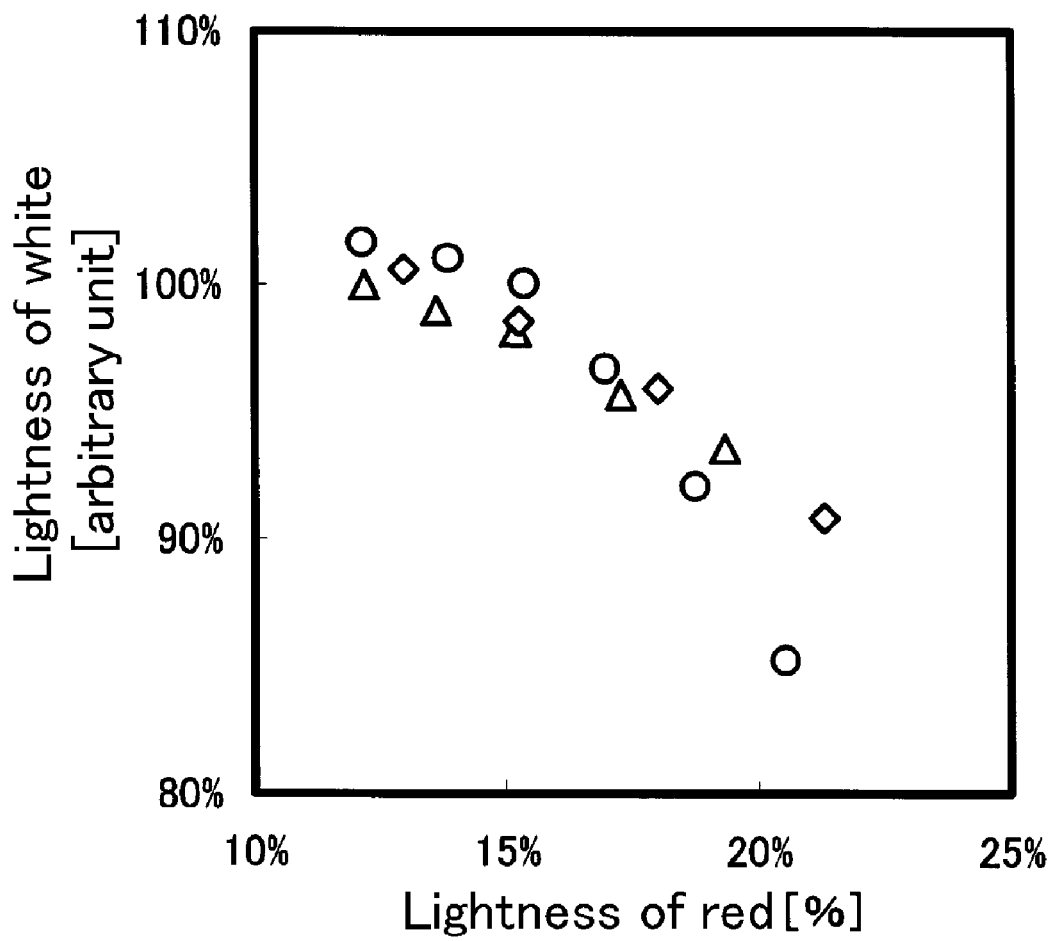
FIG. 35 is a diagram showing a relationship between a lightness of red and a lightness of white displayed by the liquid crystal display device in accordance with preferred embodiment 6 of the present invention.

FIG. 35 shows a relationship between a lightness of red and a lightness of white displayed by the liquid crystal displays shown in Tables 13 and 14. In FIG. 35, Δ corresponds to the liquid crystal display devices K1 to K5 in Table 13; and ◇ corresponds to the liquid crystal display device in Table 14. For comparison, ○ shows the liquid crystal display devices E1 to E6 in Table 7 in accordance with the preferred embodiment 3 in which the aperture areas of the red and blue sub-pixels are equivalently large and the aperture areas of the green and yellow sub-pixels are equivalently small.

the color filters, and a light-emitting efficiency of the light source of the backlight, in liquid crystal display devices M1 and M2 prepared in the present preferred embodiment.

TABLE 15

| | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| M1 | 10:8:9:7 | 1.42 | 13.2 | 92.5 | 37.4 | 0.84 |
| M2 | 10:6:8:4 | 2.50 | 17.2 | 88.7 | 32.5 | 0.93 |

According to the liquid crystal display device in Table 15, the aperture area of the red sub-pixel is relatively large and therefore the effect of improving the lightness of red is large. In addition, the blue sub-pixel has a relatively large aperture area, and the yellow sub-pixel has a small aperture area. Therefore, a light source having a high light-emitting efficiency can be used in order to maximize the chromaticity of white. Therefore, the lightness of red is increased at a relatively small aperture area ratio. As a result, the reduction in the lightness of white can be minimized.

Preferred Embodiment 8

The present preferred embodiment shows a case where red, blue, yellow, and green sub-pixels are ranked in descending order of aperture area.

Table 16 shows an aperture area ratio among the respective sub-pixels, an aperture area ratio between the sub-pixel having the largest aperture area (red sub-pixel) and the sub-pixel having the smallest aperture area (green sub-pixel), a lightness of red, a lightness of white, an average transmittance of the color filters, and a light-emitting efficiency of the light source of the backlight, in liquid crystal display devices N1 to N3 prepared in the present preferred embodiment.

TABLE 16

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| N1 | 12:9:11:10 | 1.33 | 12.2 | 100.3 | 38.3 | 0.83 |
| N2 | 14:8:12:10 | 1.75 | 13.2 | 99.6 | 36.3 | 0.87 |
| N3 | 16:8:14:10 | 2.00 | 14.1 | 99.5 | 34.4 | 0.92 |

According to the liquid crystal display devices in Table 16, the red sub-pixel has the largest aperture area, and therefore the effect of improving the lightness of red is large. In addition, the blue sub-pixel has a relatively large aperture area and the yellow sub-pixel has a relatively small aperture area. Therefore, a light source having a high light-emitting efficiency can be used in order to maximize the chromaticity of white. Therefore, the lightness of red can be improved at a relatively small aperture area ratio. As a result, the reduction in lightness of white can be minimized.

Preferred Embodiment 9

The present preferred embodiment shows a case where red, green, blue, and yellow sub-pixels are ranked in descending order of aperture area.

Table 17 shows an aperture area ratio among the respective sub-pixels, an aperture area ratio between the sub-pixel having the largest aperture area (red sub-pixel) and the sub-pixel having the smallest aperture area (yellow sub-pixel), a lightness of red, a lightness of white, an average transmittance of the color filters, and a light-emitting efficiency of the light source of the backlight, in liquid crystal display devices O1 to O6 prepared in the present preferred embodiment.

According to the liquid crystal display devices in Table 17, the red sub-pixel has a large aperture area, and therefore the effect of improving the lightness of red is large. In addition, the yellow sub-pixel has a small aperture area. Therefore, a light source with a high light-emitting efficiency can be used in order to maximize the chromaticity of white. Therefore, the lightness of red can be improved at a relatively small aperture area ratio. As a result, the reduction in lightness of white can be minimized.

Preferred Embodiment 10

The present preferred embodiment shows a case where red, blue, yellow, and green sub-pixels are ranked in descending order of aperture area.

Table 18 shows an aperture area ratio among the respective sub-pixels, an aperture area ratio between the sub-pixel having the largest aperture area (red sub-pixel) and the sub-pixel having the smallest aperture area (yellow or green sub-pixel), a lightness of red, a lightness of white, an average transmittance of the color filters, and a light-emitting efficiency of the light source of the backlight, in liquid crystal display devices P1 to P3 prepared in the present preferred embodiment.

TABLE 17

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| O1 | 12:11:10:9 | 1.33 | 13.0 | 96.3 | 38.7 | 0.79 |
| O2 | 12:11:10:8 | 1.50 | 13.7 | 96.0 | 37.9 | 0.80 |
| O3 | 14:12:10:8 | 1.75 | 14.5 | 92.5 | 37.2 | 0.79 |
| O4 | 16:14:10:8 | 2.00 | 15.4 | 89.0 | 36.9 | 0.76 |
| O5 | 14:13:12:7 | 2.00 | 15.2 | 95.9 | 35.9 | 0.84 |
| O6 | 14:13:12:6 | 2.33 | 15.8 | 95.4 | 35.0 | 0.86 |

TABLE 18

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| P1 | 12:9:10:9 | 1.33 | 12.9 | 97.8 | 38.0 | 0.82 |
| P2 | 14:8:10:8 | 1.75 | 14.8 | 94.5 | 35.3 | 0.85 |
| P3 | 16:7:10:7 | 2.29 | 16.7 | 91.2 | 32.4 | 0.89 |

According to the liquid crystal display devices in Table 18, the red sub-pixel has a large aperture area, and therefore the effect of improving the lightness of red is large. In addition, the aperture area of the blue sub-pixel is relatively large and the aperture areas of the yellow and green sub-pixels are small. Therefore, a light source with a high light-emitting efficiency can be used in order to maximize the chromaticity of white. Therefore, the lightness of red can be improved at a relatively small aperture area. As a result, the reduction in lightness of white can be minimized.

Preferred Embodiment 11

The present preferred embodiment shows a case where blue, red, green, and yellow sub-pixels are ranked in descending order of aperture area.

Table 19 shows an aperture area ratio among the respective sub-pixels, an aperture area ratio between the sub-pixel having the largest aperture area (blue sub-pixel) and the sub-pixel having the smallest aperture area (red sub-pixel), a lightness of red, a lightness of white, an average transmittance of the color filters, and a light-emitting efficiency of the light source of the backlight, in liquid crystal display devices Q1 and Q2 prepared in the present preferred embodiment.

TABLE 19

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| Q1 | 9:8:10:7 | 1.42 | 12.6 | 95.9 | 37.5 | 0.87 |
| Q2 | 8:6:10:4 | 2.50 | 15.2 | 94.1 | 32.3 | 0.99 |

According to the liquid crystal display devices in Table 19, the red sub-pixel has a relatively large aperture area and therefore the effect of improving the lightness of red is large. In addition, the aperture area of the blue sub-pixel is large and the aperture area of the yellow sub-pixel is small. Therefore, a light source having a high light-emitting efficiency can be used in order to maximize the chromaticity of white. Therefore, the lightness of red can be improved at a relatively small aperture area ratio. As a result, the reduction in lightness of white can be minimized.

Preferred Embodiment 12

The present embodiment shows a case where blue, red, yellow, and green sub-pixels are ranked in descending order of aperture area.

Table 20 shows an aperture area ratio among the respective sub-pixels, an aperture area ratio between the sub-pixel having the largest aperture area (red sub-pixel) and the sub-pixel having the smallest aperture area (green sub-pixel), a lightness of red, a lightness of white, an average transmittance of the color filters, and a light-emitting efficiency of the light source of the backlight, in liquid crystal display devices R1 to R3 prepared in the present preferred embodiment.

TABLE 20

|  | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| R1 | 11:9:12:10 | 1.33 | 11.6 | 103.9 | 38.4 | 0.85 |
| R2 | 12:8:14:10 | 1.75 | 12.2 | 105.1 | 36.4 | 0.91 |
| R3 | 15:8:16:10 | 2.00 | 13.7 | 102.6 | 34.0 | 0.95 |

According to the liquid crystal display devices in Table 20, the aperture area of the red sub-pixel is relatively large and therefore the effect of improving the lightness of red is large. Further, the aperture area of the blue sub-pixel is large and the aperture areas of the yellow sub-pixel are relatively small. Therefore, a light source with a high light-emitting efficiency can be used in order to maximize the chromaticity of white. Therefore, the lightness of red can be improved at a relatively small aperture area ratio. As a result, the reduction in lightness of white can be minimized.

Preferred Embodiment 13

The present preferred embodiment shows a case where blue, green, red, and yellow sub-pixels are ranked in descending order of aperture area.

Table 21 shows an aperture area ratio among the respective sub-pixels, an aperture area ratio between the sub-pixel having the largest aperture area (red sub-pixel) and the sub-pixel having the smallest aperture area (yellow sub-pixel), a lightness of red, a lightness of white, an average transmittance of the color filters, and a light-emitting efficiency of the light source of the backlight, in liquid crystal display devices S1 to S7 prepared in the present preferred embodiment.

high light-emitting efficiency can be used in order to maximize the chromaticity of white. Therefore, the lightness of red can be improved at a relatively small aperture area ratio. As a result, the reduction in lightness of white can be minimized.

Preferred Embodiment 14

The present preferred embodiment shows a case where blue and green sub-pixels, followed by red and yellow sub-pixels, are ranked in descending order of aperture area.

Table 22 shows an aperture area ratio among the respective sub-pixels, an aperture area ratio between the sub-pixel having the largest aperture area (blue or green sub-pixel) and the sub-pixel having the smallest aperture area (yellow sub-pixel), a lightness of red, a lightness of white, an average transmittance of the color filters, and a light-emitting effi-

TABLE 21

| | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| S1 | 10:11:12:8 | 1.50 | 12.3 | 102.5 | 37.9 | 0.86 |
| S2 | 10:11:12:7 | 1.71 | 13.0 | 102.3 | 36.9 | 0.88 |
| S3 | 10:11:12:7 | 1.71 | 13.3 | 101.9 | 36.9 | 0.87 |
| S4 | 10:11:12:6 | 2.00 | 13.9 | 101.0 | 35.8 | 0.89 |
| S5 | 10:11:12:5 | 2.40 | 15.0 | 99.8 | 34.7 | 0.91 |
| S6 | 11:12:13:6 | 2.17 | 14.6 | 99.8 | 35.3 | 0.89 |
| S7 | 13:14:15:6 | 2.50 | 15.5 | 98.9 | 34.4 | 0.91 |

According to the liquid crystal display devices in Table 21, the aperture area of the yellow sub-pixel is particularly small. Therefore, a red component of light can be emitted at a high intensity from a backlight, and therefore, the effect of improving the lightness of red is large. In addition, the aperture area of the blue sub-pixel is large and the aperture area of the yellow sub-pixel is small. Therefore, a light source with a ciency of the light source of the backlight, in liquid crystal display devices T1 to T3 prepared in the present preferred embodiment.

TABLE 22

| | Aperture area ratio (red:green:blue:yellow) | The largest aperture area/ The smallest aperture area | Lightness of red (%) | Lightness of white | Color filter transmittance (%) | Light-emitting efficiency of backlight |
|---|---|---|---|---|---|---|
| T1 | 9:10:10:7 | 1.43 | 12.5 | 100.8 | 38.2 | 0.83 |
| T2 | 9:10:10:5 | 2.00 | 14.4 | 99.9 | 35.9 | 0.88 |
| T3 | 9:10:10:4 | 2.50 | 15.7 | 98.2 | 34.6 | 0.90 |

According to the liquid crystal display in Table 22, the aperture area of the yellow sub-pixel is particularly small. Therefore, a red component of light can be emitted at a higher intensity from a backlight and the like. Therefore, the effect of improving the lightness of red is large. In addition, the aperture area of the blue sub-pixel is large and the aperture area of the yellow sub-pixel is small. Therefore, a light source with a high light-emitting efficiency can be used in order to maximize the chromaticity of white. Therefore, the lightness of red can be improved at a relatively small aperture area ratio. As a result, the reduction in lightness of white can be minimized.

As mentioned above, preferred embodiments 1 to 14 show the case where the color filter having spectral characteristics in FIG. 7, 13, or 22 is used. However, the color filter is not limited thereto, and even using a color filter different in hue or chroma from that of these preferred embodiments, the effect of improving the lightness of red can be observed. Specifically, such a color filter can be applied to a display device in which light having a dominant wavelength of about 595 nm or more and about 650 nm or less passes through a red sub-pixel; light having a dominant wavelength of about 490 nm or more and about 555 nm or less passes through a green sub-pixel; light having a dominant wavelength of about 450 nm or more and about 490 nm or less passes through a blue sub-pixel; light having a dominant wavelength of about 565 nm or more and about 580 nm or less passes through a yellow sub-pixel. Preferred embodiments 1 to 14 show the configuration in which the pixel is defined by the red, green, blue, and yellow sub-pixels. The pixel configuration is not limited thereto. The same effect can be obtained even in the case where the pixel is defined by red, green, blue, yellow, and magenta sub-pixels.

According to preferred embodiments 1 to 14, a common CCFT is used as the light source of the backlight, but the light source is not limited thereto. The above-mentioned effect of improving the lightness of red can be observed even using a backlight different from that used in preferred embodiments, such as a white light-emitting diode (a combination of a blue LED and a yellow fluorescence), RGB-LED, a hot cathode fluorescent tube (HCFT), an organic electroluminescence, and a field emission display (FED).

In addition, according to preferred embodiments 1 to 14, the mixing ratio among the fluorescent materials of red, green, and blue, is varied to adjust spectral characteristics of the light source, and thereby the chromaticity of white displayed by the liquid crystal display device is maximized. However, the way of optimizing the chromaticity of white is not limited thereto. For example, the chromaticity of white displayed by the liquid crystal display device may be maximized by modifying an optical design of a liquid crystal layer or an optical film, or varying an applied voltage at the time of display of white.

According to preferred embodiments 1 to 14, a transmissive liquid crystal display device which performs display using a backlight is used. However, in addition to the transmissive liquid crystal display device, the present invention can be preferably used in liquid crystal display devices in other display systems such as a transflective liquid crystal display device which performs transmissive display using a backlight and performs reflective display using external light and/or a front light and a reflective liquid crystal display device which performs display using a light source such as a front light, or used in various display devices such as a cathode ray tube (CRT), an organic electroluminescent display device (OELD), a plasma display panel (PDP), and a field emission displays (FED) such as a surface-conduction electron-emitter display (SED).

In the present description, if the terms "or more" and "or less" are used, the value (boundary value) is included.

The present application claims priority under the Paris Convention and the domestic law in the country to be entered into national phase on Patent Application No. 2006-169206 filed in Japan on Jun. 19, 2006, the entire contents of which are hereby incorporated by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A display device comprising a display surface,
   the display surface including a pixel consisting of red, green, blue, and yellow sub-pixels,
   wherein the display device includes red, green, blue, and yellow color filters, and a light source device,
   the red sub-pixel has the largest aperture area, and the blue sub-pixel has the largest aperture area,
   the aperture area of the red sub-pixel is larger than that of the green sub-pixel and also larger than that of the yellow sub-pixel,
   the aperture area of the blue sub-pixel is larger than that of the green sub-pixel and also larger than that of the yellow sub-pixel, and
   a lightness of red accounts for 12% or more and 25% or less relative to a lightness of white.

2. The display device according to claim 1,
   wherein the green sub-pixel has the smallest aperture area, and the yellow sub-pixel has the smallest aperture area.

3. The display device according to claim 2,
   wherein the aperture areas of the red sub-pixel is 1.22 to 1.86 times as large as that of each of the green and yellow sub-pixels, and
   the aperture area of the blue sub-pixel is 1.22 to 1.86 times as large as that of each of the green and yellow sub-pixels.

4. The display device according to claim 3,
   wherein in the pixel, the red sub-pixel is the largest in number, and the blue sub-pixel is the largest in number.

5. The display device according to claim 4,
   wherein the pixel includes blue sub-pixels different in color characteristics.

6. The display device according to claim 4,
   wherein the pixel includes red sub-pixels different in color characteristics.

7. The display device according to claim 2,
   wherein the aperture area of the red sub-pixel is three times or less as large as an aperture area of a sub-pixel whose aperture area is the smallest.

8. The display device according to claim 7,
   wherein in the pixel, the red sub-pixel is the largest in number, and the blue sub-pixel is the largest in number.

9. The display device according to claim 8,
   wherein the pixel includes blue sub-pixels different in color characteristics.

10. The display device according to claim 8,
    wherein the pixel includes red sub-pixels different in color characteristics.

11. The display device according to claims 2,
    wherein in the pixel, the red sub-pixel is the largest in number, and the blue sub-pixel is the largest in number.

12. The display device according to claim 11,
    wherein the pixel includes blue sub-pixels different in color characteristics.

13. The display device according to claim 11,
    wherein the pixel includes red sub-pixels different in color characteristics.

14. The display device according to claim 1,
wherein the aperture area of the red sub-pixel is three times or less as large as an aperture area of a sub-pixel whose aperture area is the smallest.

15. The display device according to claim 14,
wherein in the pixel, the red sub-pixel is the largest in number, and the blue sub-pixel is the largest in number.

16. The display device according to claim 15,
wherein the pixel includes blue sub-pixels different in color characteristics.

17. The display device according to claim 16,
wherein the aperture area of the green sub-pixel is smaller than the aperture area of the yellow sub-pixel, and the green sub-pixel has the smallest aperture area.

18. The display device according to claim 16,
wherein the aperture area of the yellow sub-pixel is smaller than the aperture area of the green sub-pixel, and the yellow sub-pixel has the smallest aperture area.

19. The display device according to claim 15,
wherein the pixel includes red sub-pixels different in color characteristics.

20. The display device according to claim 19,
wherein the aperture area of the green sub-pixel is smaller than the aperture area of the yellow sub-pixel, and the green sub-pixel has the smallest aperture area.

21. The display device according to claim 19,
wherein the aperture area of the yellow sub-pixel is smaller than the aperture area of the green sub-pixel, and the yellow sub-pixel has the smallest aperture area.

22. The display device according to claim 15,
wherein the aperture area of the green sub-pixel is smaller than the aperture area of the yellow sub-pixel, and the green sub-pixel has the smallest aperture area.

23. The display device according to claim 15,
wherein the aperture area of the yellow sub-pixel is smaller than the aperture area of the green sub-pixel, and the yellow sub-pixel has the smallest aperture area.

24. The display device according to claim 14,
wherein the aperture area of the green sub-pixel is smaller than the aperture area of the yellow sub-pixel, and the green sub-pixel has the smallest aperture area.

25. The display device according to claim 14,
wherein the aperture area of the yellow sub-pixel is smaller than the aperture area of the green sub-pixel, and the yellow sub-pixel has the smallest aperture area.

26. The display device according to claim 1,
wherein in the pixel, the red sub-pixel is the largest in number, and the blue sub-pixel is the largest in number.

27. The display device according to claim 26,
wherein the pixel includes blue sub-pixels different in color characteristics.

28. The display device according to claim 27,
wherein the aperture area of the green sub-pixel is smaller than the aperture area of the yellow sub-pixel, and the green sub-pixel has the smallest aperture area.

29. The display device according to claim 27,
wherein the aperture area of the yellow sub-pixel is smaller than the aperture area of the green sub-pixel, and the yellow sub-pixel has the smallest aperture area.

30. The display device according to claim 26,
wherein the pixel includes red sub-pixels different in color characteristics.

31. The display device according to claim 30,
wherein the aperture area of the green sub-pixel is smaller than the aperture area of the yellow sub-pixel, and the green sub-pixel has the smallest aperture area.

32. The display device according to claim 30,
wherein the aperture area of the yellow sub-pixel is smaller than the aperture area of the green sub-pixel, and the yellow sub-pixel has the smallest aperture area.

33. The display device according to claim 26,
wherein the aperture area of the green sub-pixel is smaller than the aperture area of the yellow sub-pixel, and the green sub-pixel has the smallest aperture area.

34. The display device according to claim 26,
wherein the aperture area of the yellow sub-pixel is smaller than the aperture area of the green sub-pixel, and the yellow sub-pixel has the smallest aperture area.

35. The display device according to claim 1,
wherein the aperture area of the green sub-pixel is smaller than the aperture area of the yellow sub-pixel, and the green sub-pixel has the smallest aperture area.

36. The display device according to claim 1,
wherein the aperture area of the yellow sub-pixel is smaller than the aperture area of the green sub-pixel, and the yellow sub-pixel has the smallest aperture area.

* * * * *